United States Patent
Marrs et al.

(10) Patent No.: US 10,334,759 B2
(45) Date of Patent: Jun. 25, 2019

(54) UNIVERSAL INLET DUCT SYSTEM FOR SIDE AIR INTAKE EQUIPMENT

(71) Applicant: Panduit Corp., Tinley Park, IL (US)

(72) Inventors: Samuel M. Marrs, Bradley, IL (US); Edward R. Kello, Downers Grove, IL (US)

(73) Assignee: Panduit Corp., Tinley Park, IL (US)

( * ) Notice: Subject to any disclaimer, the term of this patent is extended or adjusted under 35 U.S.C. 154(b) by 1416 days.

(21) Appl. No.: 14/090,287

(22) Filed: Nov. 26, 2013

(65) Prior Publication Data
US 2015/0147954 A1    May 28, 2015

(51) Int. Cl.
*H05K 7/20* (2006.01)

(52) U.S. Cl.
CPC ..... *H05K 7/20736* (2013.01); *H05K 7/20727* (2013.01)

(58) Field of Classification Search
CPC .... A47F 3/0469; E06B 3/80; F24F 2009/005; F24F 2011/0087; F24F 9/00; F25D 23/02; F25D 2500/02; H05K 7/20727; H05K 7/20736; H05K 7/20
USPC ..... 312/116, 115, 138.1, 236, 297; 160/241, 160/327, 328, 354, 23.1, 265, 330, 349.1; 62/256, 249, 265, 255; 432/64; 454/184, 454/284, 187
See application file for complete search history.

(56) References Cited

U.S. PATENT DOCUMENTS

| | | | | |
|---|---|---|---|---|
| 2,734,500 A | * | 2/1956 | Myers | B60H 1/00364 126/110 AA |
| 2,772,624 A | * | 12/1956 | Carnes | F24F 13/062 454/312 |
| 2,840,057 A | * | 6/1958 | Zoller | F22B 21/081 122/480 |
| 3,031,772 A | * | 5/1962 | Sasnett | D06F 58/22 219/400 |
| 3,116,123 A | * | 12/1963 | Sasnett | D06F 58/28 34/527 |
| 3,125,941 A | * | 3/1964 | Grout et al. | B60H 1/26 454/156 |
| 3,197,886 A | * | 8/1965 | Brame | D06F 58/00 251/149.2 |

(Continued)

FOREIGN PATENT DOCUMENTS

CN    204613848 U    9/2015
WO    2008144678 A1    11/2008

*Primary Examiner* — Steven B McAllister
*Assistant Examiner* — Samantha A Miller
(74) *Attorney, Agent, or Firm* — Christopher S. Clancy; James H. Williams; Anthony Bartosik

(57) ABSTRACT

An inlet duct system includes a duct body having a bottom wall and two side walls having at least one opening. An adjustable internal baffle is secured to the duct body such that the internal baffle can be positioned in multiple locations within an internal cavity defined by the duct body, inhibiting the flow of air between a front portion and a rear portion of the internal cavity. A first side duct is removably attached to the duct body and forms an air flow chamber that receives a fluid from an opening in one of the side walls and delivers the fluid above the duct body. A first side baffle is positioned within the air flow chamber, adjacent the internal baffle, inhibiting the flow of air between a front portion and a rear portion of the air flow chamber.

19 Claims, 32 Drawing Sheets

(56) References Cited

U.S. PATENT DOCUMENTS

| | | | | |
|---|---|---|---|---|
| 3,202,080 | A * | 8/1965 | Cook | F24F 7/025 |
| | | | | 415/211.2 |
| 3,202,081 | A * | 8/1965 | Cook | F24F 7/025 |
| | | | | 415/211.2 |
| 3,263,337 | A * | 8/1966 | Sjogren | F26B 15/10 |
| | | | | 159/49 |
| 6,579,168 | B1 | 6/2003 | Webster | |
| 6,850,408 | B1 * | 2/2005 | Coglitore | G06F 1/18 |
| | | | | 312/223.1 |
| 7,033,267 | B2 | 4/2006 | Rasmussen | |
| 7,096,936 | B1 * | 8/2006 | Chastine | F25D 17/065 |
| | | | | 165/253 |
| 7,839,635 | B2 | 11/2010 | Donowho et al. | |
| 7,894,190 | B2 | 2/2011 | Davis et al. | |
| 8,040,673 | B2 | 10/2011 | Krietzman | |
| 8,144,464 | B2 | 3/2012 | VanDerVeen et al. | |
| 8,259,449 | B2 * | 9/2012 | Novotny | H05K 7/20709 |
| | | | | 361/696 |
| 8,310,832 | B2 | 11/2012 | VanDerVeen et al. | |
| 8,472,183 | B1 * | 6/2013 | Ross | H05K 7/20736 |
| | | | | 361/679.48 |
| 8,737,067 | B1 * | 5/2014 | Kim | H05K 7/1492 |
| | | | | 342/175 |
| 8,857,120 | B2 * | 10/2014 | Marrs | A62C 35/00 |
| | | | | 312/201 |
| 9,332,863 | B2 * | 5/2016 | Ramey | A47F 5/0006 |
| 9,699,935 | B1 * | 7/2017 | Marrs | H05K 7/183 |
| 9,709,754 | B2 * | 7/2017 | Sanders | G02B 6/3825 |
| 9,723,747 | B1 * | 8/2017 | Marrs | H05K 7/1489 |
| 9,872,417 | B2 * | 1/2018 | Held | H05K 7/20727 |
| 2004/0257766 | A1 * | 12/2004 | Rasmussen | H05K 7/20572 |
| | | | | 361/689 |
| 2004/0264124 | A1 * | 12/2004 | Patel | G06F 1/20 |
| | | | | 361/679.46 |
| 2005/0050907 | A1 * | 3/2005 | Unger | F25D 17/045 |
| | | | | 62/187 |
| 2005/0280986 | A1 * | 12/2005 | Coglitore | G06F 1/20 |
| | | | | 361/679.49 |
| 2007/0281639 | A1 * | 12/2007 | Clidaras | G06F 1/20 |
| | | | | 455/128 |
| 2008/0186668 | A1 * | 8/2008 | Naufel | H05K 7/20736 |
| | | | | 361/679.5 |
| 2009/0227197 | A1 * | 9/2009 | Lewis, II | H05K 7/20736 |
| | | | | 454/284 |
| 2009/0255653 | A1 * | 10/2009 | Mills | H05K 7/20736 |
| | | | | 165/104.34 |
| 2010/0003911 | A1 | 1/2010 | Graczyk et al. | |
| 2010/0073868 | A1 * | 3/2010 | Mayer | F24F 13/10 |
| | | | | 361/679.51 |
| 2010/0238626 | A1 * | 9/2010 | Linhares, Jr. | H05K 7/20736 |
| | | | | 361/690 |
| 2010/0315788 | A1 * | 12/2010 | Vanderveen | H05K 7/20718 |
| | | | | 361/724 |
| 2011/0053485 | A1 * | 3/2011 | Huang | H05K 7/20145 |
| | | | | 454/184 |
| 2011/0096498 | A1 * | 4/2011 | Tambe | G06F 1/20 |
| | | | | 361/695 |
| 2012/0012279 | A1 | 1/2012 | Appino et al. | |
| 2012/0044645 | A1 * | 2/2012 | Aruga | H05K 7/20727 |
| | | | | 361/695 |
| 2012/0270492 | A1 | 10/2012 | VanDerVeen et al. | |
| 2012/0293951 | A1 * | 11/2012 | Jai | H05K 7/20727 |
| | | | | 361/679.53 |
| 2013/0115869 | A1 * | 5/2013 | Alshinnawi | H05K 7/20736 |
| | | | | 454/184 |
| 2013/0309957 | A1 | 11/2013 | Fleming et al. | |
| 2014/0040524 | A1 * | 2/2014 | Luck | G06F 1/181 |
| | | | | 710/306 |
| 2014/0063737 | A1 * | 3/2014 | Desmarets | H05K 7/20736 |
| | | | | 361/695 |
| 2014/0118937 | A1 * | 5/2014 | Adrian | H05K 7/20727 |
| | | | | 361/695 |
| 2014/0148086 | A1 * | 5/2014 | Cash | H05K 7/20145 |
| | | | | 454/184 |
| 2014/0355201 | A1 * | 12/2014 | Alshinnawi | H05K 7/20736 |
| | | | | 361/679.47 |

* cited by examiner

UNIVERSAL INLET DUCT SYSTEM FOR SIDE AIR INTAKE EQUIPMENT

FIELD OF THE INVENTION

The present invention generally relates to inlet duct systems for network cabinets, and, more specifically, to inlet duct systems for use with side air intake electronic equipment.

BACKGROUND

Network cabinets/containment areas store and secure electronic equipment, such as servers and switches, which generate heat. As network technology advances, electronic equipment generates more and more heat as a byproduct of higher speeds and improved performance. Therefore, cooling systems for network cabinets/containment areas are essential to the development and integration of advanced network technology, both now and in the future.

Current network cabinets/containment areas are using more types of electronic equipment with varying air flow requirements, which presents problems when used in environments where hot and cold air are separated in the network cabinet/containment area. Network cabinets/containment areas are typically designed for electronic equipment having front to back airflow and segregate the "cold" cooling air in the front of the cabinet and the "hot" exhaust air to the rear of the cabinet. However, using electronic equipment having side intake and/or exhaust vents or using different types of electronic equipment having varying intake and exhaust venting requirements can cause problems with typical front/rear segregated cabinets.

For example, as shown in FIGS. 1 and 2, some electronic equipment 10, 20 may have inlet flows "I" through side inlets in both sides of the electronic equipment 10, 20 and an exhaust flow "E" through exhaust vents in the rear of the electronic equipment 10, 20. In addition, as shown in FIG. 3, some electronic equipment 30 may have inlet flows I through side inlets in both sides of the electronic equipment 30 and exhaust flows E through exhaust vents in one or more sides and in the rear of the electronic equipment 30. Finally, as shown in FIG. 4, some electronic equipment 40 may have inlet flows I through one side and an exhaust flow E through the opposite side of the electronic equipment 40. Problems can arise when one or more of these types of electronic equipment are used. For example, the inlet flow(s) I can end up on the "hot" side of the separation in the cabinet or can end up in the same area as its own exhaust flow(s) E or exhaust flow(s) E of other electronic equipment, which can cause the electronic equipment to intake hot exhaust air and overheat and possibly shut down a network.

A common issue that arises with all of the different types of electronic equipment with different air flow requirements is that each of the different air flow requires different venting to address the specific cooling requirements of the electronic equipment. In addition, electronic equipment having the same air flow configuration could be of different sizes, as shown in FIGS. 1 and 2, which could also require different venting. Therefore, a duct system is needed that is adjustable and can be used with different electronic equipment having side air intakes and a variety of different exhaust flows.

SUMMARY

In one example, an inlet duct system includes a duct body, an adjustable internal baffle, a first side duct, and a first side baffle. The duct body has a bottom wall and two side walls that extend from opposing side edges of the bottom wall. Each side wall has at least one opening formed therethrough. The adjustable internal baffle is secured to the duct body such that the internal baffle can be positioned in multiple locations within an internal cavity defined by the duct body. The internal baffle partitions the internal cavity into a front portion and a rear portion and inhibits the flow of air between the front portion and the rear portion of the internal cavity. The first side duct is removably attached to the duct body and has a top wall, a bottom wall, and a side wall extending between the top wall and the bottom wall. The first side duct forms an air flow chamber configured to receive air from the at least one opening in one of the side walls and deliver the air to a location above the duct body. The first side baffle is positioned within the air flow chamber of the first side duct, adjacent the internal baffle. The first side baffle extends between the top wall and the bottom wall of the first side duct and between the side wall of the first side duct and the side wall of the duct body to partition the air flow chamber into a front portion and a rear portion and inhibit the flow of air between the front portion and the rear portion of the air flow chamber.

In another example, an inlet duct system kit includes a duct body, an adjustable internal baffle, first and second side ducts, first and second side baffles, and a blanking panel. The duct body includes a bottom wall and two side walls extending from opposing side edges of the bottom wall. Each side wall has at least one opening formed therethrough. The adjustable internal baffle is securable to the duct body such that the internal baffle can be positioned in multiple locations within an internal cavity defined by the duct body. The internal baffle partitions the internal cavity into a front portion and a rear portion and inhibits the flow of air between the front portion and the rear portion of the internal cavity. The first and second side ducts are removably attachable to the duct body and each include a top wall, a bottom wall, and a side wall extending between the top wall and the bottom wall. The first and second side ducts form an air flow chamber configured to receive air from the at least one opening in one of the side walls and deliver the air to a location above the duct body. The first and second side baffles are positionable within the air flow chambers, adjacent the internal baffle, and are configured to extend between the top wall and the bottom wall of a corresponding side duct and between the side wall of the corresponding side duct and the side wall of the duct body to partition the air flow chamber into a front portion and a rear portion and inhibit the flow of air between the front portion and the rear portion of the air flow chamber. The blanking panel is removably attachable to the duct body and configured to prevent the flow of air through the at least one opening formed in the side wall of the duct body adjacent the blanking panel.

BRIEF DESCRIPTION OF THE DRAWINGS

Certain examples of the present invention are illustrated by the accompanying figures. It should be understood that the figures are not necessarily to scale and that details that are not necessary for an understanding of the invention or that render other details difficult to perceive may be omitted. It should be understood, of course, that the invention is not necessarily limited to the particular examples illustrated herein.

DETAILED DESCRIPTION

Figure 2:
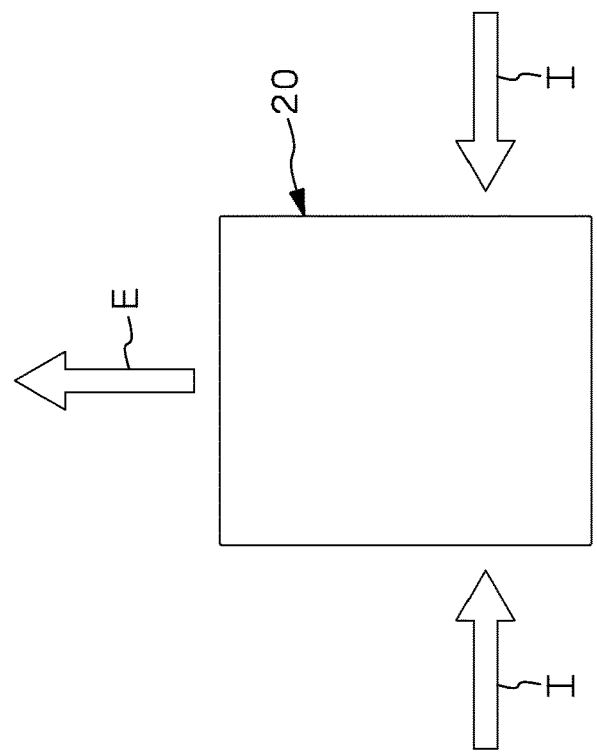
FIG. 2 is another schematic representation of electronic equipment having side air intakes and rear exhaust, the electronic equipment having a depth less than the electronic equipment of FIG. 1.
Figure 1:
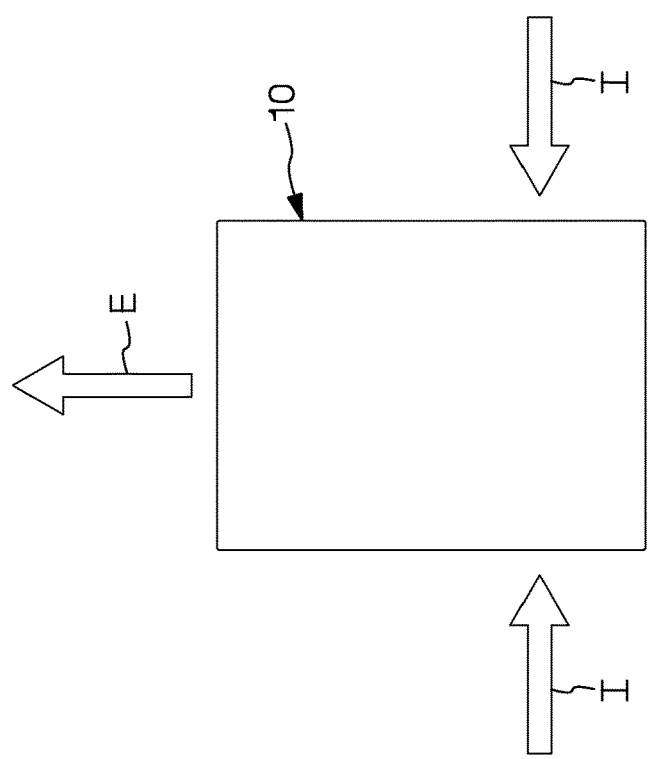
FIG. 1 is a schematic representation of electronic equipment having side air intakes and rear exhaust.
Figure 4:
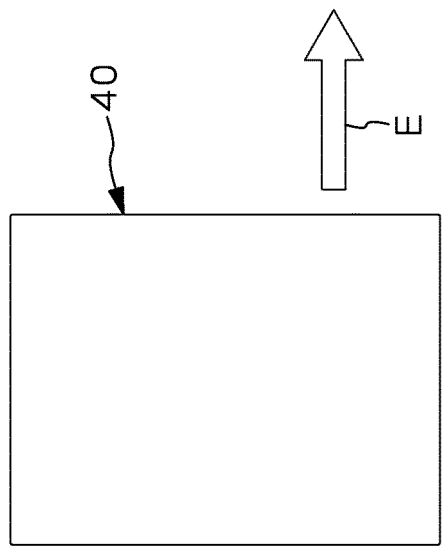
FIG. 4 is a schematic representation of electronic equipment having side intake on one side and side exhaust on the opposite side.
Figure 3:
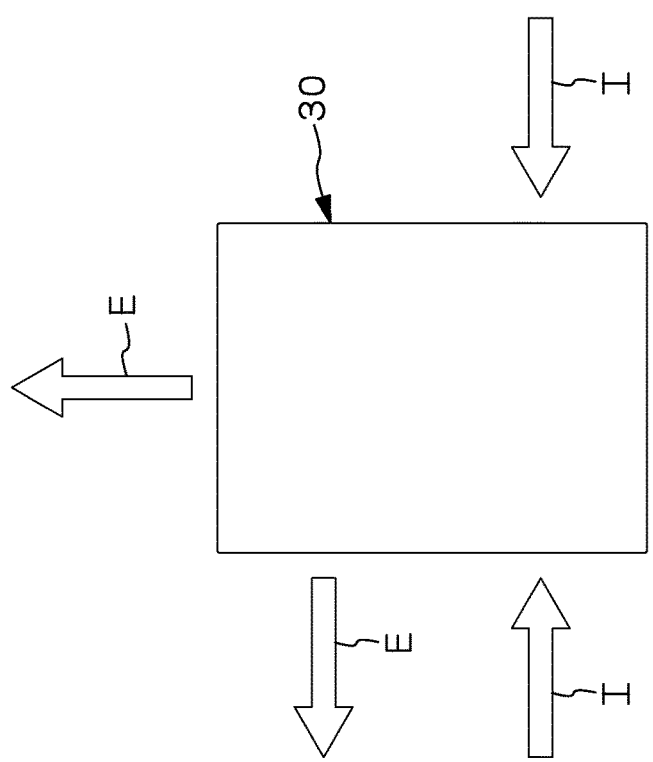
FIG. 3 is a schematic representation of electronic equipment having side air intakes, side exhaust, and side and rear exhaust.
Figure 5:
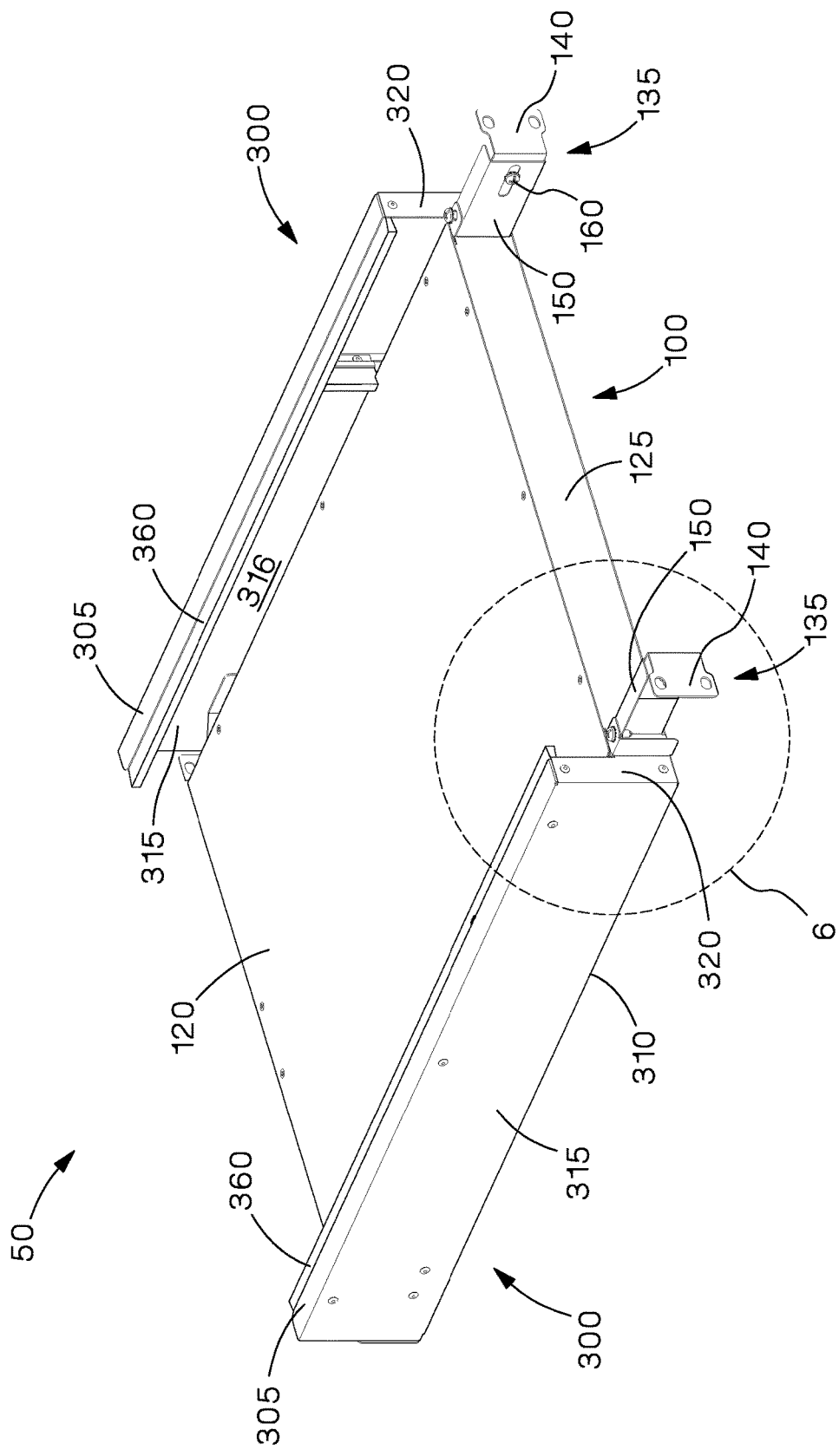
FIG. 5 is a rear perspective view of one example of an inlet duct system.

The example inlet duct systems described herein can be adjusted and configured to work with various electronic equipment having different exhaust and side intake configurations to create a pathway of "cold" air to the side inlets of the electronic equipment without restricting the exhaust flow. The examples are adaptable for electronic equipment with inlets on one or both sides of the electronic equipment and exhausts on a rear and/or side of the electronic equipment.

Referring to FIGS. 5-13, one example of an inlet duct system 50 generally includes a duct body 100, an adjustable internal baffle 200, a side duct 300, and a side baffle 400. As described in more detail below, depending on the configuration for particular electronic equipment, inlet duct system 50 could have two side ducts 300 or one side duct 300 and a blanking panel 500.

Figure 7:
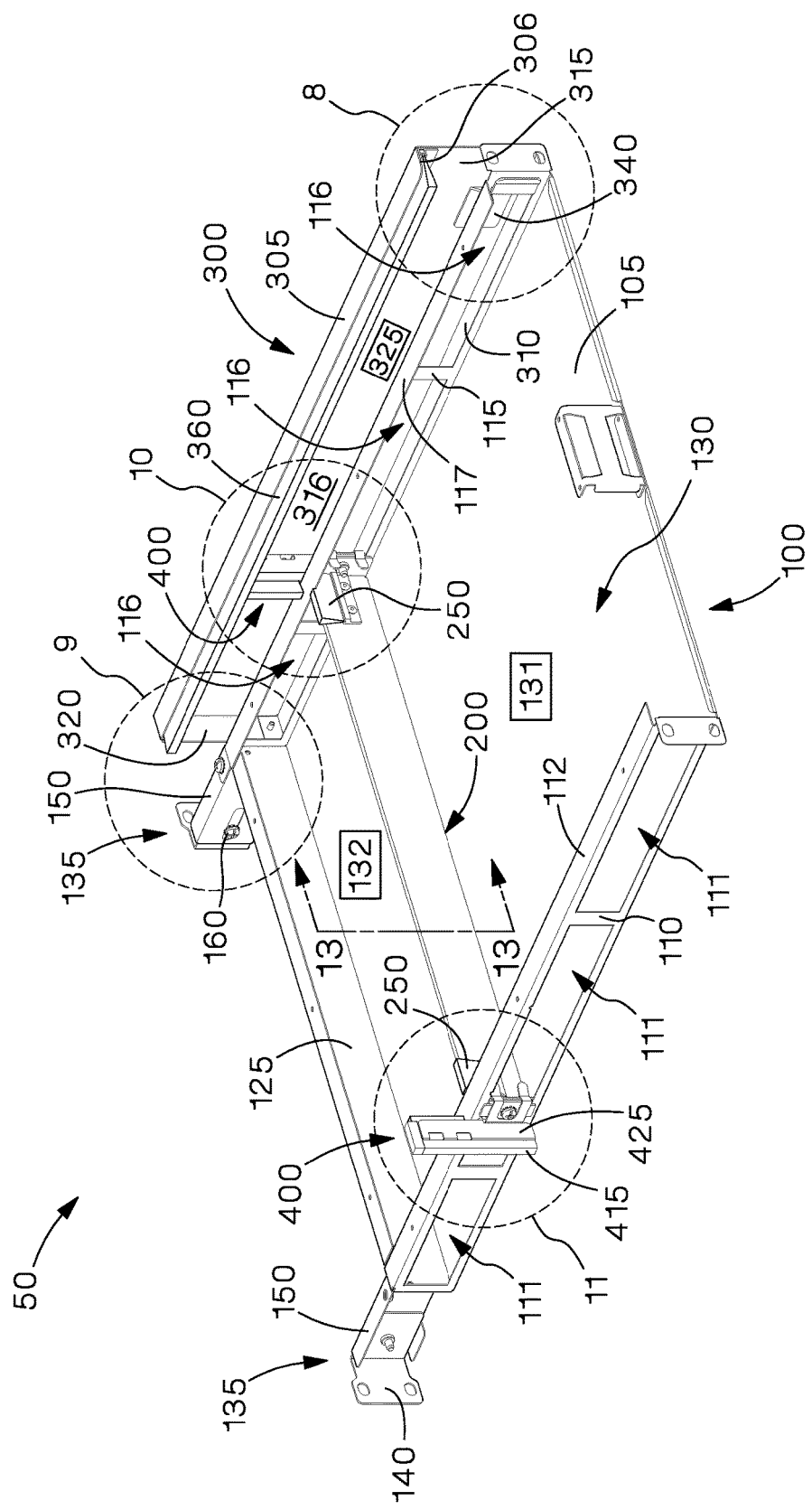
FIG. 7 is a front perspective view of the inlet duct system of FIG. 5 with the top wall and one side duct removed.
Figure 8:
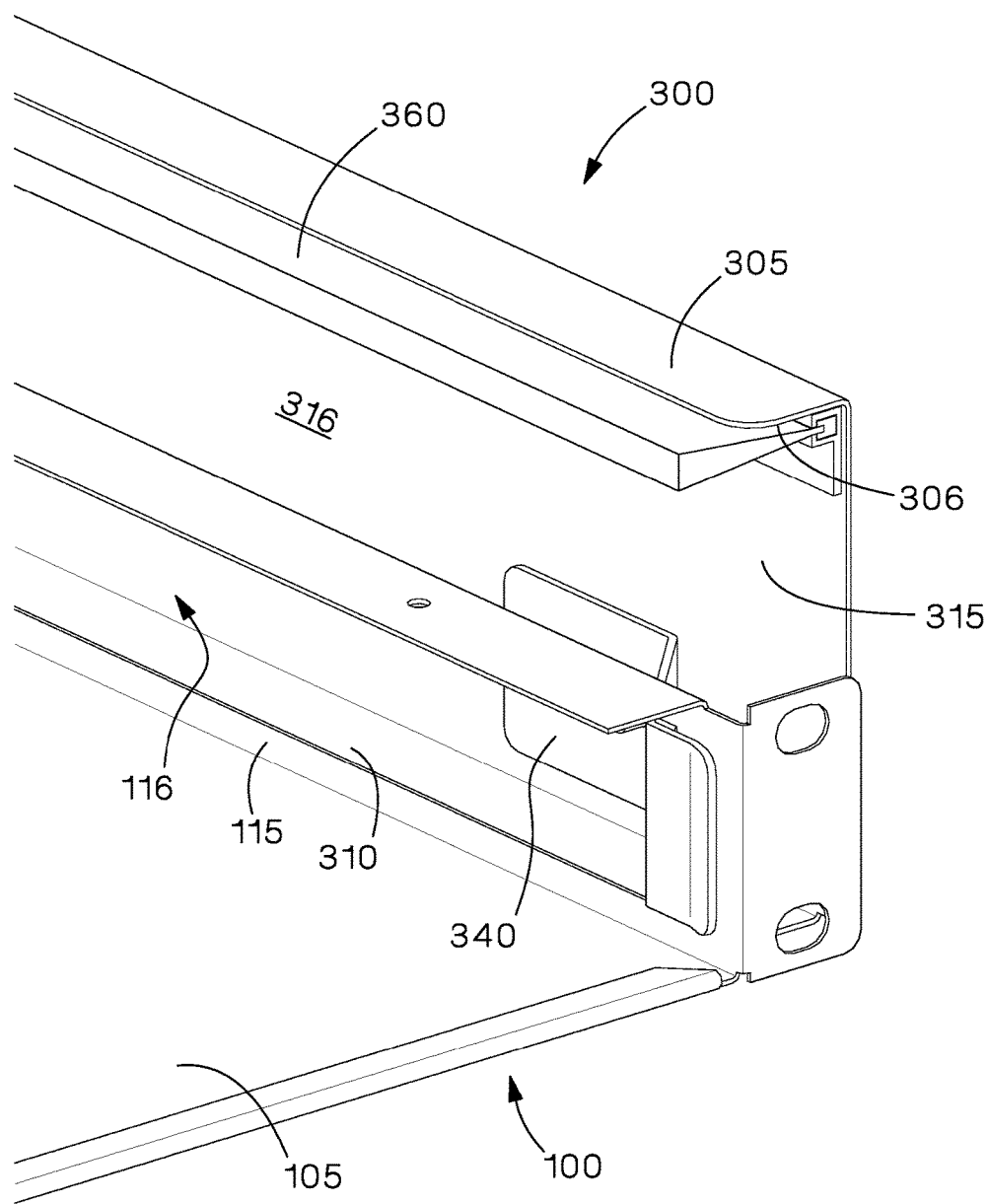
FIG. 8 is an expanded view of a portion of the inlet duct system of FIG. 7.
Figure 9:
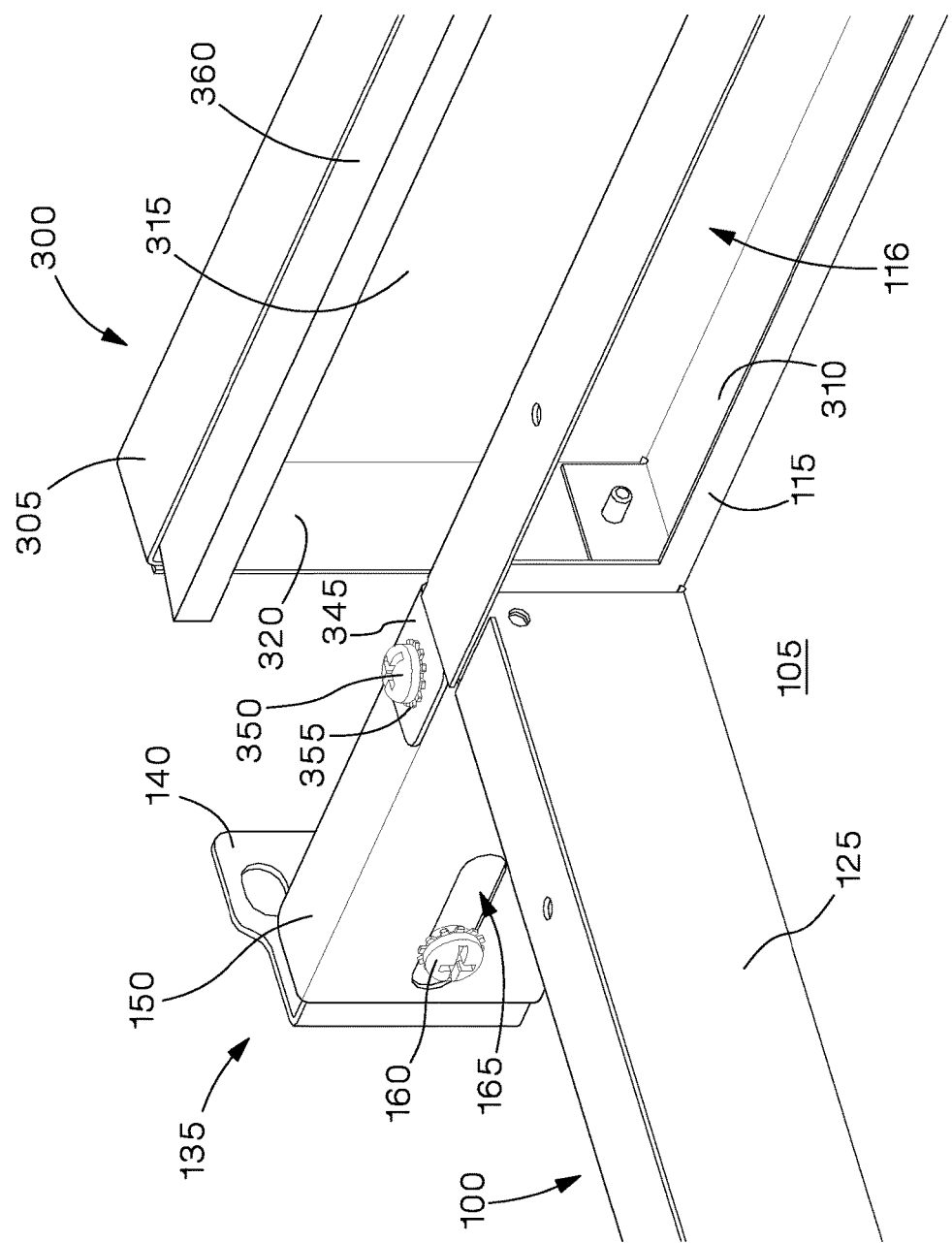
FIG. 9 is an expanded view of another portion of the inlet duct system of FIG. 7.
Figure 10:
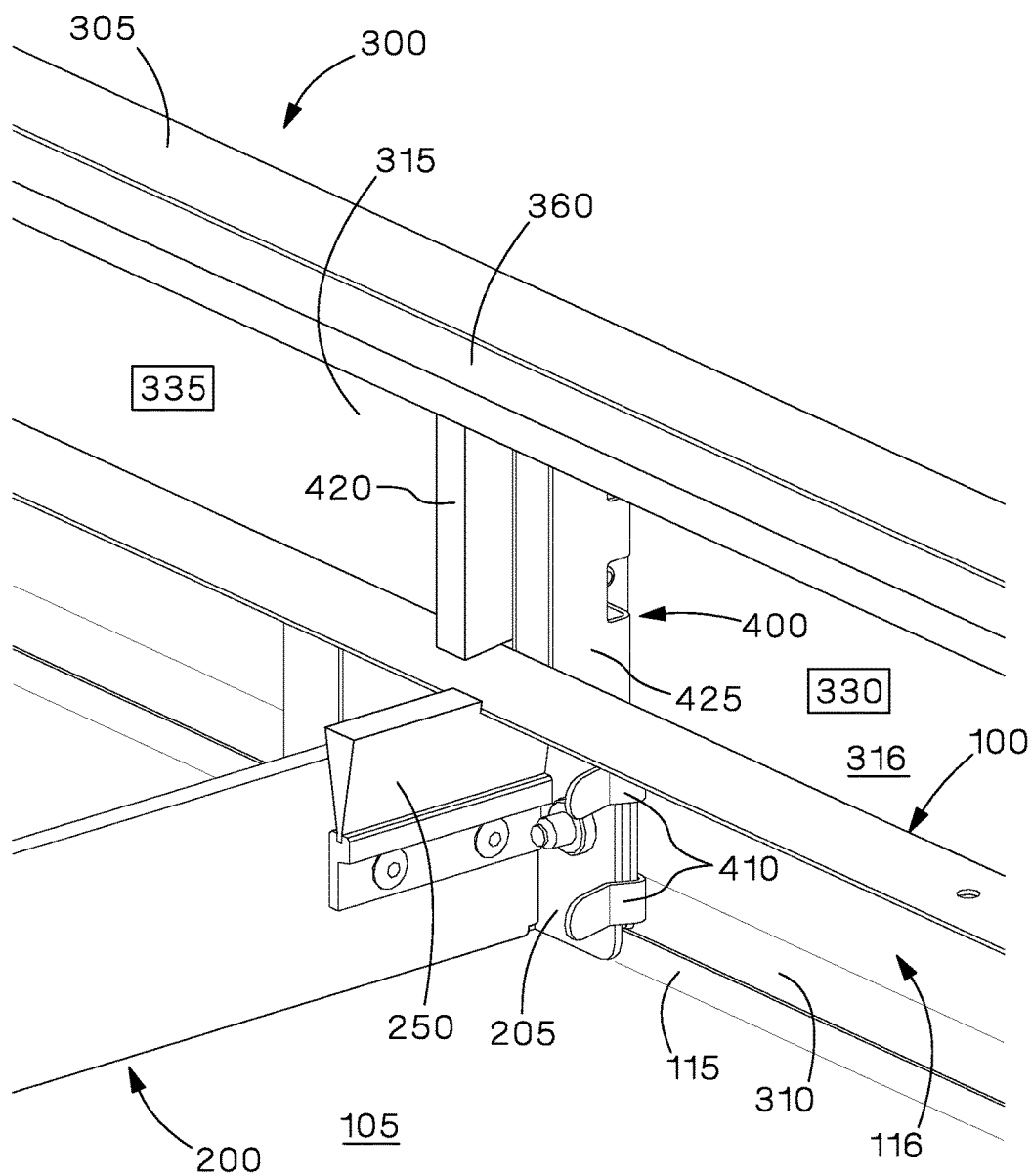
FIG. 10 is an expanded view of another portion of the inlet duct system of FIG. 7.

In the example shown, duct body 100 has a bottom wall 105, two side walls 110, 115, a top wall 120, and a back wall 125 that together define an internal cavity 130 of duct body 100. Side walls 110, 115 extend from opposing side edges of bottom wall 105 and each side wall 110, 115 has a plurality of openings 111, 116 to allow the flow of air from the internal cavity through side walls 110, 115. As shown in FIG. 7, each side wall 110, 115 has three openings 111, 116, however side walls 110, 115 can have any number of openings 111, 116 as desired. Each side wall 110, 115 can also have a lip 112, 117 (see FIG. 7) extending generally perpendicular from a top edge of side wall 110, 115, opposite bottom wall 105, which can be used to support top wall 120 and provide a surface to secure top wall 120 to side walls 110, 115. Furthermore, each side wall 110, 115 can also have a generally U-shaped rear mounting portion 150 that is configured to engage rear support mounting brackets 135, as discussed in more detail below. In the example shown, rear mounting portion 150 extends from side wall 110, 115 outside of back wall 125 and is offset from the portion of side wall 110, 115 that forms openings 111, 116. Top wall 120 extends between side walls 110, 115 and is positioned opposite bottom wall 105. Top wall 120 can be a separate part that is secured to side walls 110, 115. Back wall 125 extends between top wall 120, bottom wall 105, and side walls 110, 115 and can be formed integral with one of the other walls or a separate part that is secured to one of the other walls.

Referring specifically to FIGS. 7 and 10-13, in the example shown adjustable internal baffle 200 is secured to side walls 110 of duct body 100 and can be positioned in multiple locations within internal cavity 130 to partition internal cavity 130 into a front portion 131 and a rear portion 132 (see FIG. 7) and inhibit the flow of air between front and rear portions 131, 132 of internal cavity 130. Internal baffle 200 can be positioned in its rear most position, proximate back wall 125, for deep electronic equipment or in any number of forward positions, spaced from back wall 125, for shallower electronic equipment. Alternatively, internal baffle 200 can be secured to bottom wall 105 or in any other manner desired, as long as internal baffle 200 is moveable and can be positioned in multiple locations within internal cavity 130.

Internal baffle 200 is secured to side walls 110, 115 by first and second clamp plates 205, which are secured to opposite ends of internal baffle 200 by screws 210 and lock washers 215. One end of internal baffle 200 and a clamp plate 205 are positioned on opposite sides of one of the side walls 110, 115 adjacent one of the openings 111, 116 and screw 210 is threaded into threaded openings (not shown) formed in the end of internal baffle and clamp plate 205 and tightened. Lock washers 215 can also be used under the heads of screws 210 to prevent screws 210 from loosening. To adjust the location of internal baffle 200 for electronic equipment of different sizes, screws 210 on both sides of internal baffle 200 are loosened and internal baffle 200 is slid forward or backward within internal cavity 130 to a desired position. Screws 210 can then be retightened to secure internal baffle 200 in the new position.

As shown in FIGS. 7, and 10-13, internal baffle 200 can also have one or more top seal members 250 that are attached to internal baffle 200 and extend above internal baffle 200 to provide a seal against top wall 120 of duct body 100.

Figure 11:
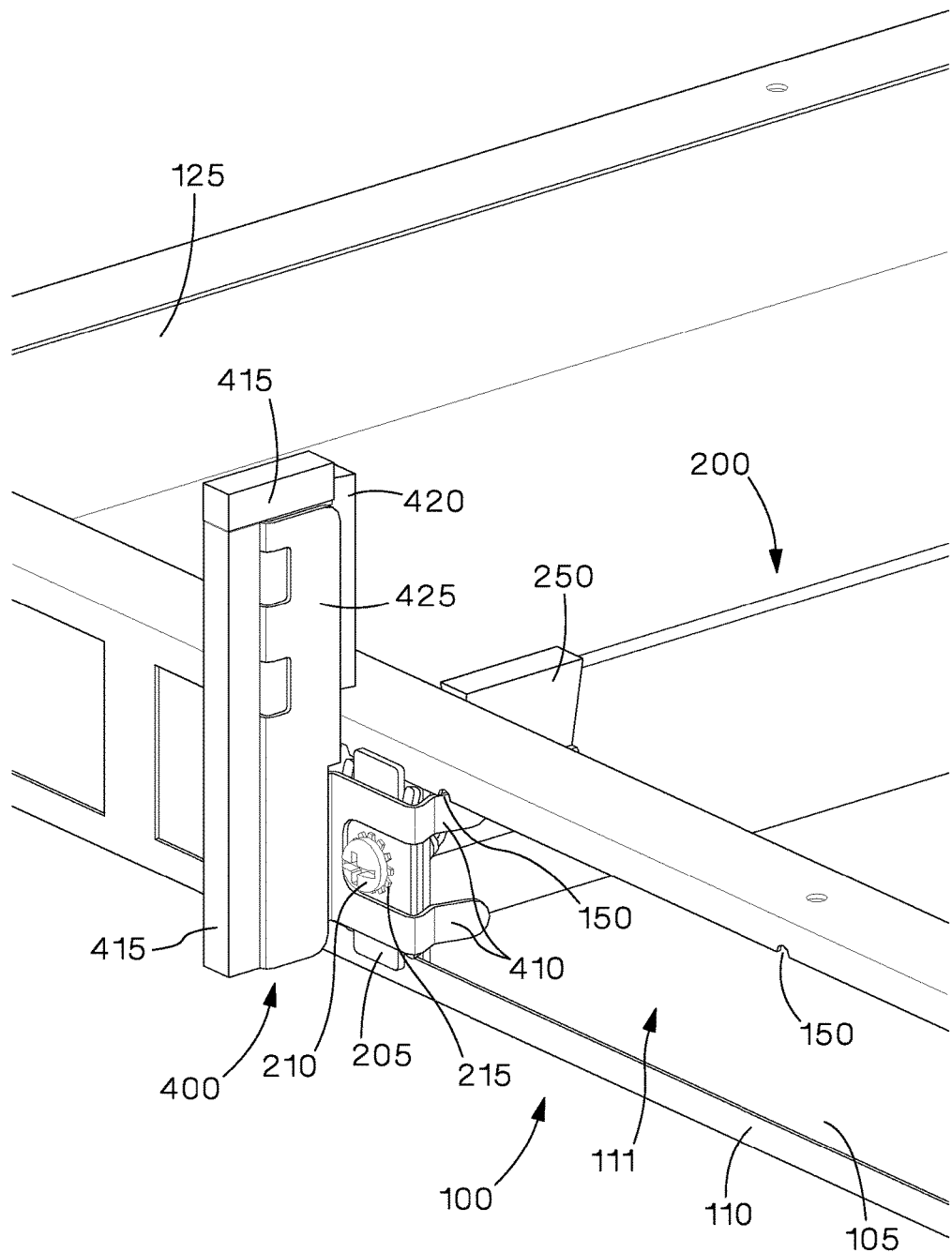
FIG. 11 is an expanded view of another portion of the inlet duct system of FIG. 7.
Figure 12:
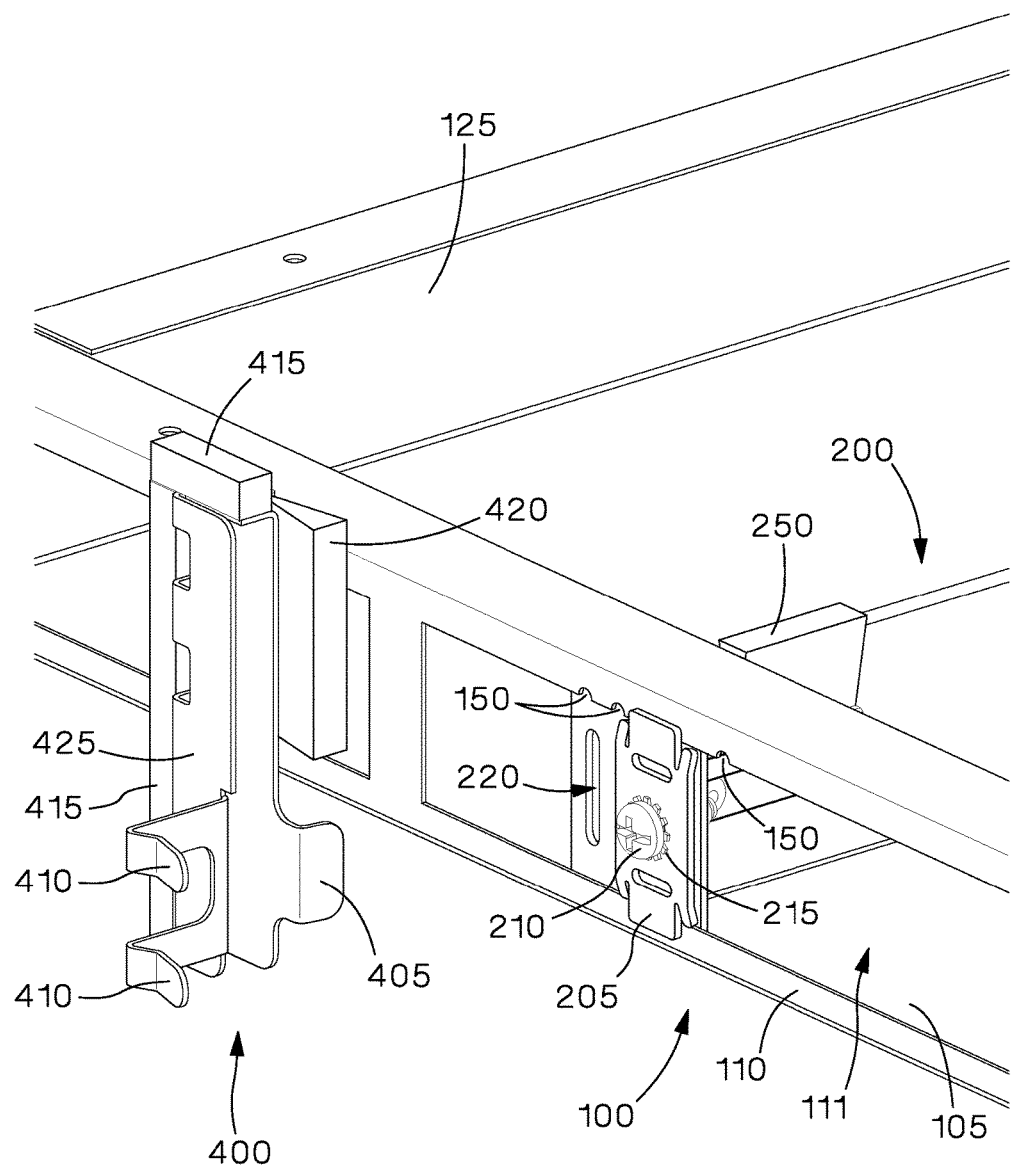
FIG. 12 is an exploded view of the portion of the inlet duct system of FIG. 11 with the side baffle removed and rotated.
Figure 13:
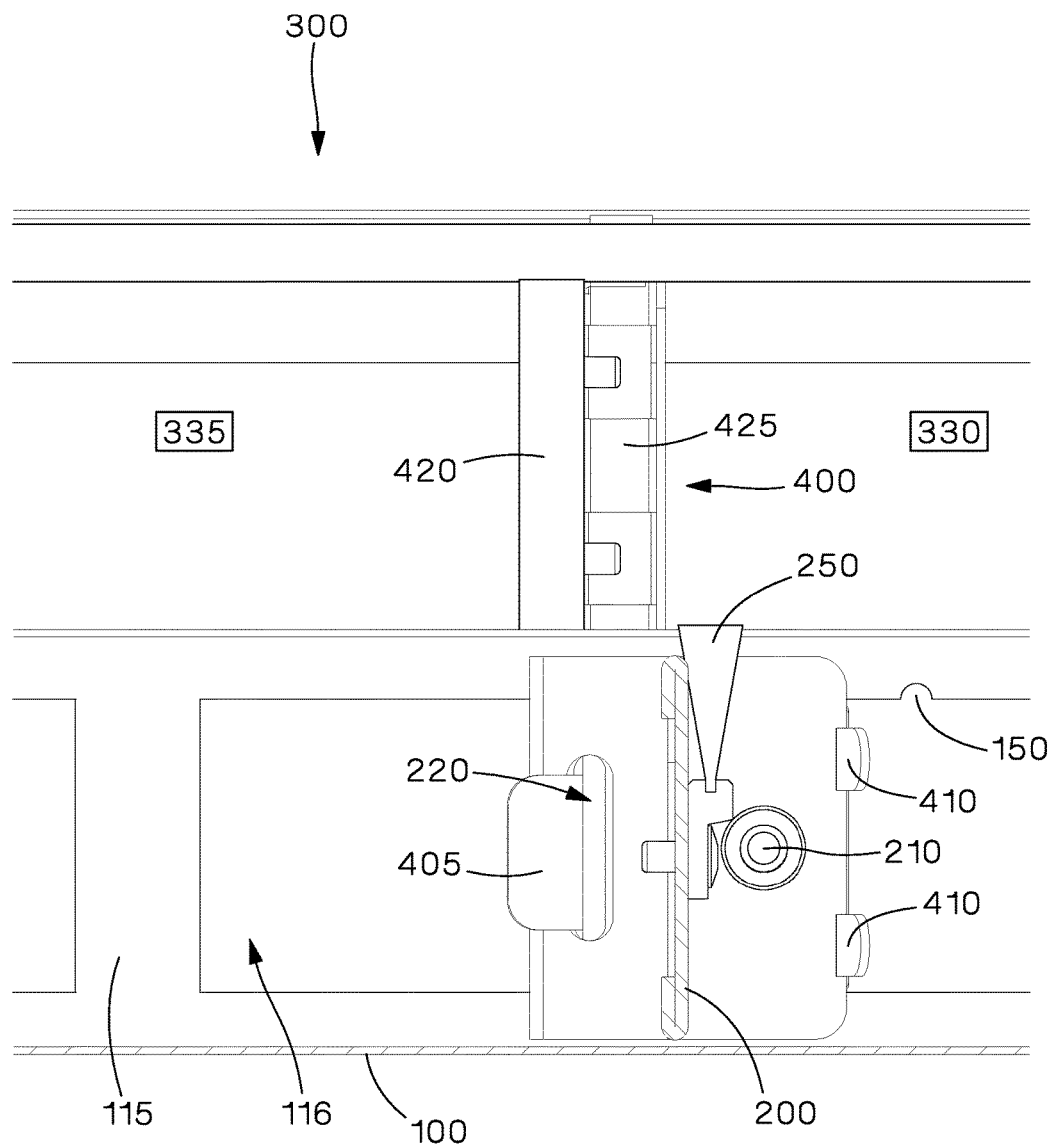
FIG. 13 is a cross sectional view of the inlet duct system of FIG. 7 taken along line 13-13.

As can best be seen in FIGS. 11-13, side walls 110, 115 of duct box 100 can also have notches 170 formed around the edges of openings 111, 116, which can be used to designate predefined locations for internal baffle 200 that can be used for particular electronic equipment. By lining up a particular landmark, such as the end of internal baffle 200, slot 220 in the end of internal baffle 200, or some other predetermined landmark, internal baffle 200 can be easily preset for specific electronic equipment. Internal baffle 200 can be preset by an end user, prior to shipment to an end user, or even in the manufacturing facility for preconfigured cabinet applications. In addition to the predefined locations indicated by notches 170, internal baffle 200 could also be moved in smaller increments to accommodate tolerances and variations in the size of electronic equipment in the field or in the manufacturing facility.

Side ducts 300 can be removably attached to duct body 100 on either side or both sides of duct body 100, proximate each side wall 110, 115. Side ducts 300 are identical mirror images of each other and, therefore, only one side duct 300 will be describe in detail herein. Referring specifically to FIGS. 5-10, side duct 300 has a top wall 305, a bottom wall 310, a side wall 315, and a back wall 320, which together form an air flow chamber 325 that can receive air from openings 111, 116 in sidewalls 110, 115 and deliver the air to electronic equipment located above duct body 100, as described in more detail below.

In the particular example shown, side duct 300 is attached to duct body 100 through a mounting tab 340 and a mounting flange 345, as shown in FIGS. 6-9. Mounting tab 340 has a general stair step configuration having a first portion secured to side wall 315 of side duct 300 and a second portion spaced from side wall 315. Mounting tab 340 extends from inner side surface 316 of side wall 315 and the second portion of mounting tab 340 slides into or otherwise engages an opening 111, 116 in side wall 110, 115 of duct body 100. Mounting tab 340 slides into the front opening 111, 116 in side wall 110, 115 and captures the front of side duct 300, holding it against duct body 100.

Mounting flange 345 extends from back wall 320 of side duct 300 and has a hole (not shown) that aligns with a corresponding hole (not shown) in rear mounting portion 150 of side wall 110, 115. Once mounting tab 340 is engaged with side wall 110,115 and the holes in mounting flange 345 and rear mounting portion 150 are aligned, side duct 300 can be secured with a threaded member, such as a screw 350 and lock washer 355, inserted through the holes in mounting tab 340 and rear mounting portion 150.

As shown in FIG. 5-10, side duct 300 can also include a seal member 360 that extends from top wall 305 to seal against a top or side of electronic equipment used with inlet duct system 100. In the example shown, seal member 360 is a brush seal, but could also be a flap seal or any other well known seal. Use of a brush seal (having bristles that are very flexible) allows for different width electronic equipment to be used with inlet duct system 50 and still have the brush seal engage the electronic equipment creating a tight seal.

Side baffles 400 are used with side ducts 300 and can be positioned within air flow chamber 325 of side duct 300, preferably adjacent internal baffle 200, to partition air flow chamber 325 into a front portion 330 and a rear portion 335 and inhibit the flow of air between front and rear portions 330, 335. As with side ducts 300, side baffles 400 are identical mirror images of each other and, therefore, only one side baffle 400 will be describe in detail herein.

As best shown in FIGS. 7 and 10-13, side baffle 400 extends vertically between top wall 305 and bottom wall 310 of side duct 300 and horizontally between side wall 315 of side duct 300 and side wall 110, 115 of duct body 100. Side baffle 400 has a main body 425, which in the example shown is a generally U-shaped body. Foam seal 415 is attached to and extends from the top and the side of main body 425 to form an airtight seal against inner side surface 315 and inner top surface 306 of side duct 300. In the example shown, foam seal 415 has a top portion and a separate side portion, however, foam seal 415 could be formed as a single part or could be constructed as any number of seals as desired. In addition, rather than foam, a brush seal or any other well known type of seal could be used.

Side baffle 400 also has a mounting tab 405 and at least one latch finger 410, which are used to removably secure side baffle 400 to internal baffle 200 and allow side baffle 400 to move with internal baffle 200. Mounting tab 405 extends from one side of main body 425 and has a generally L-shaped configuration to engage slot 220 formed in the end of internal baffle 200. Latch fingers 410 extend from another side of main body 425, opposite mounting tab 405, and also have a generally L-shaped configuration to engage and edge of clamp plate 205 on the end of internal baffle 200. A distal end of latch fingers 410 have a slight bend or protrusion, which is used to securely engage the end of clamp plate 205. To install side baffle 400, mounting tab 405 is aligned with and inserted into slot 220 in the side of internal baffle 200 and side baffle 400 is then rotated against internal baffle 200 (and clamp plate 205) so that latch fingers 410 snap onto clamp plate 205. Once side baffle 400 has been secured to internal baffle 200, clamp plate 200 can be loosened by loosening screw 210 and the entire baffle assembly (internal baffle 200 and side baffle 400) can be adjusted along openings 111, 116 in side walls 110, 115 of duct body 100. For electronic equipment having an inlet and an exhaust on the same side, internal baffle 200 and side baffle 400 can be placed between the inlet and outlet keeping the cool inlet air and the hot exhaust air separated.

Side baffle 400 can also have a brush seal 420 that forms a seal against electronic equipment used with inlet duct system 100. Brush seal 420 can be attached to and extend inwardly from main body 425 to seal against the back or side of the electronic equipment. Alternatively, brush seal 420 could be a flap seal or any other well known seal desired.

To provide flexibility for use with cabinets and/or racks of various sizes, inlet duct system 50 can also have a pair of adjustable rear support mounting brackets 135. Rear support mounting brackets 135 are identical mirror images of each other and only one will be described herein. Referring to FIGS. 5-7 and 9, rear support mounting bracket 135 is generally L-shaped, slides within rear mounting portion 150 of side wall 115, and has a mounting flange 140 configured to secure rear support mounting bracket 135 to a corresponding vertical support member of a cabinet or rack. A screw 160 is inserted through a slot 165 formed in rear mounting portion 150 of side wall 115 and is threaded into a hole in rear support mounting bracket 135 to moveably attach rear support mounting bracket 135 to side wall 115.

Figure 6:
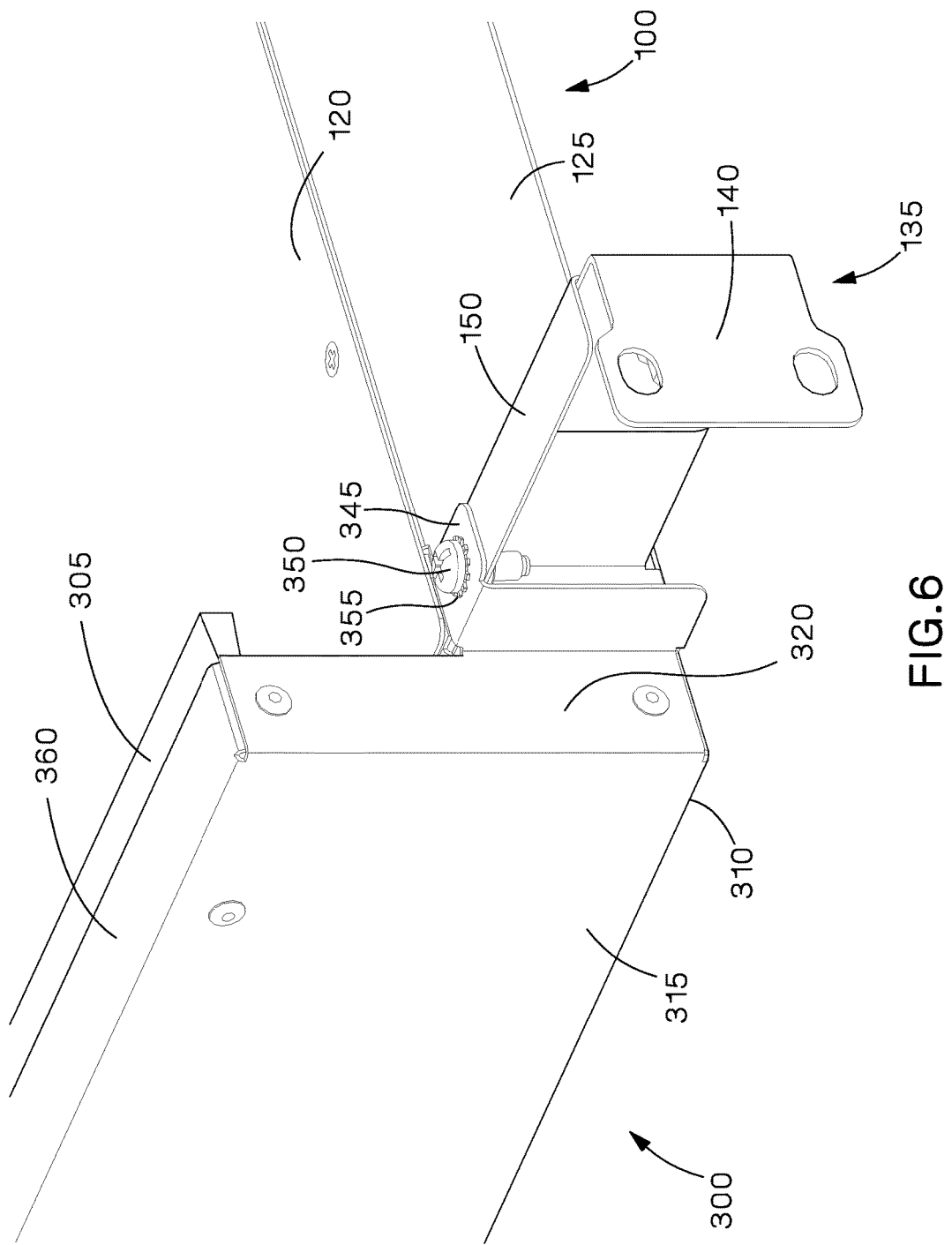
FIG. 6 is an expanded view of a portion of the inlet duct system of FIG. 5.

As best seen in FIG. 6, rear support mounting bracket 135 is installed with mounting flange 140 extending from the outer end of the rear mounting portion 150, but it is likewise contemplated that rear support mounting bracket 135 may be installed with mounting flange 140 extending from the inner end of the rear mounting portion 150.

Figure 14:
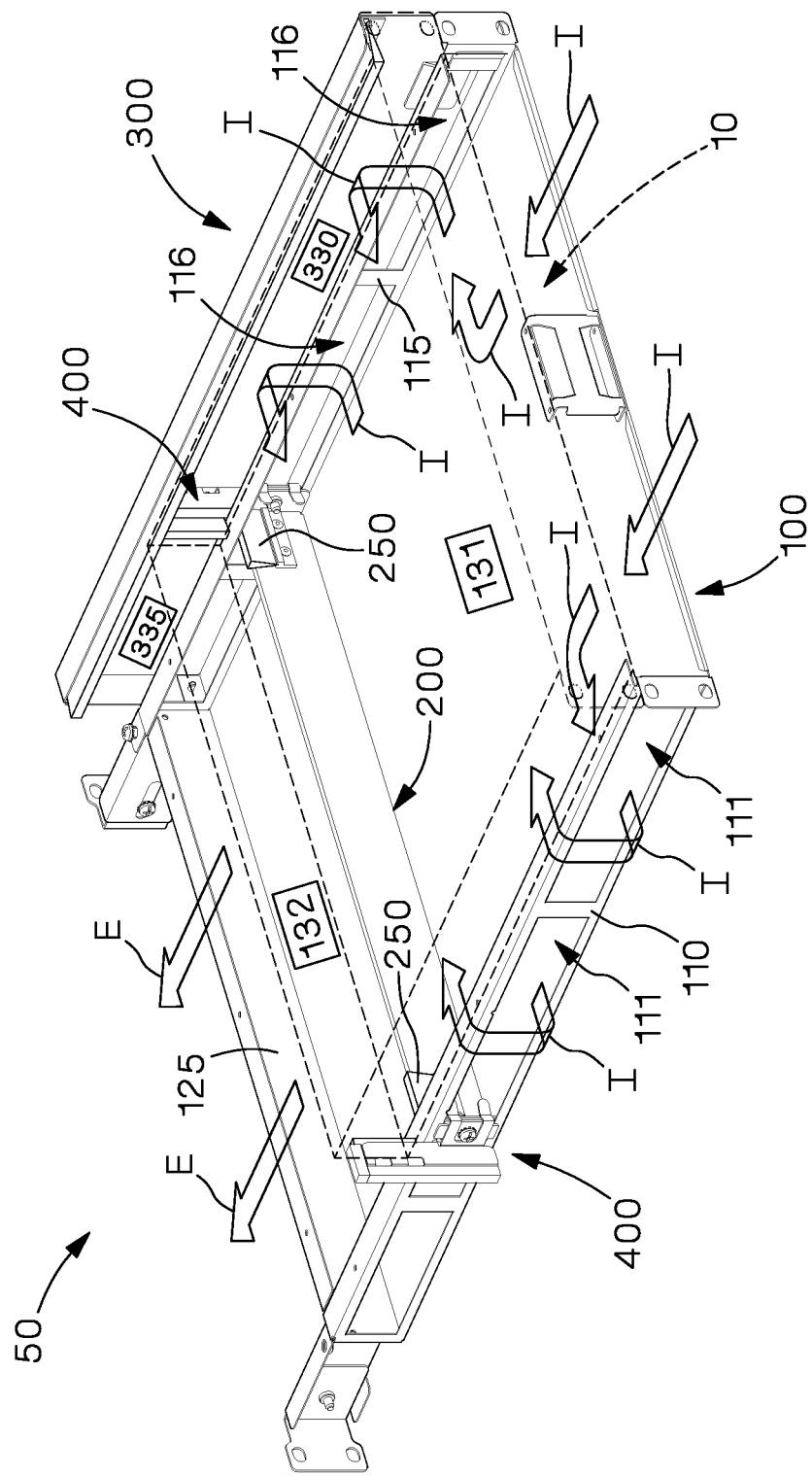
FIG. 14 is a front perspective view of the inlet duct system of FIG. 5 with the top wall removed, one side duct removed, and electronic equipment having side air inlets and rear exhaust shown in phantom.
Figure 15:
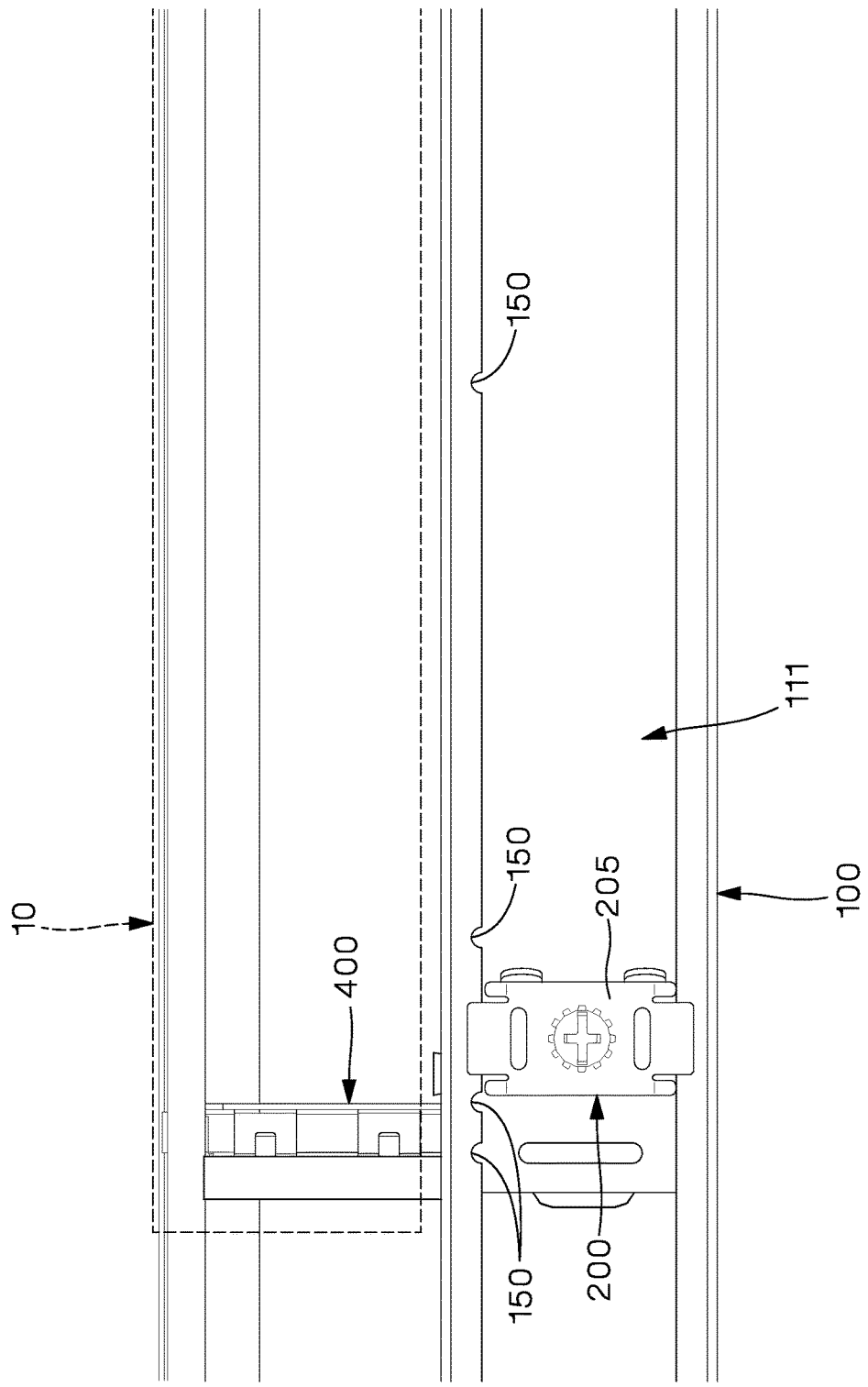
FIG. 15 is an expanded side view of the inlet duct system of FIG. 14 with the side baffle removed.

Referring to FIG. 14-15, an example inlet duct system 50 is shown configured for use with electronic equipment 10 (shown in phantom) having inlet flow on both sides of the equipment and exhaust flow on the rear of the equipment. The left side duct 300 and top wall 120 of duct body 100 have been removed for ease of description. In the configuration shown, internal baffle 200 is spaced from back wall 125 of duct body 100 and internal baffle 200 and side baffles 400 are positioned near the back of electronic equipment 10. The inlet flow I of cooling air can enter an open front portion of duct body 100 and flow into front portion 131 of internal cavity 130. Internal baffle 200 will inhibit the cooling air from flowing to rear portion 132 and direct inlet flow I out of openings 111, 116 in side walls 110, 115 and into front portion 330 of airflow chamber 325. Side baffles 400 will inhibit the cooling air from flowing to rear portion 335 and direct inlet flow I upwards and into the side intake vents of electronic equipment 10. Heated air will be exhausted from rear exhaust vents of electronic equipment and exhaust flow E will be directed rearwardly. The position of internal baffle 200 and side baffles 400 will also prevent the hot exhaust air from flowing from rear portions 335 of air flow chambers 325 of side ducts 300 back into front portions 300 and prevent the hot exhaust air from flowing from rear portion 132 of internal cavity 130 of duct body 100 back into front portion 131.

Figure 16:
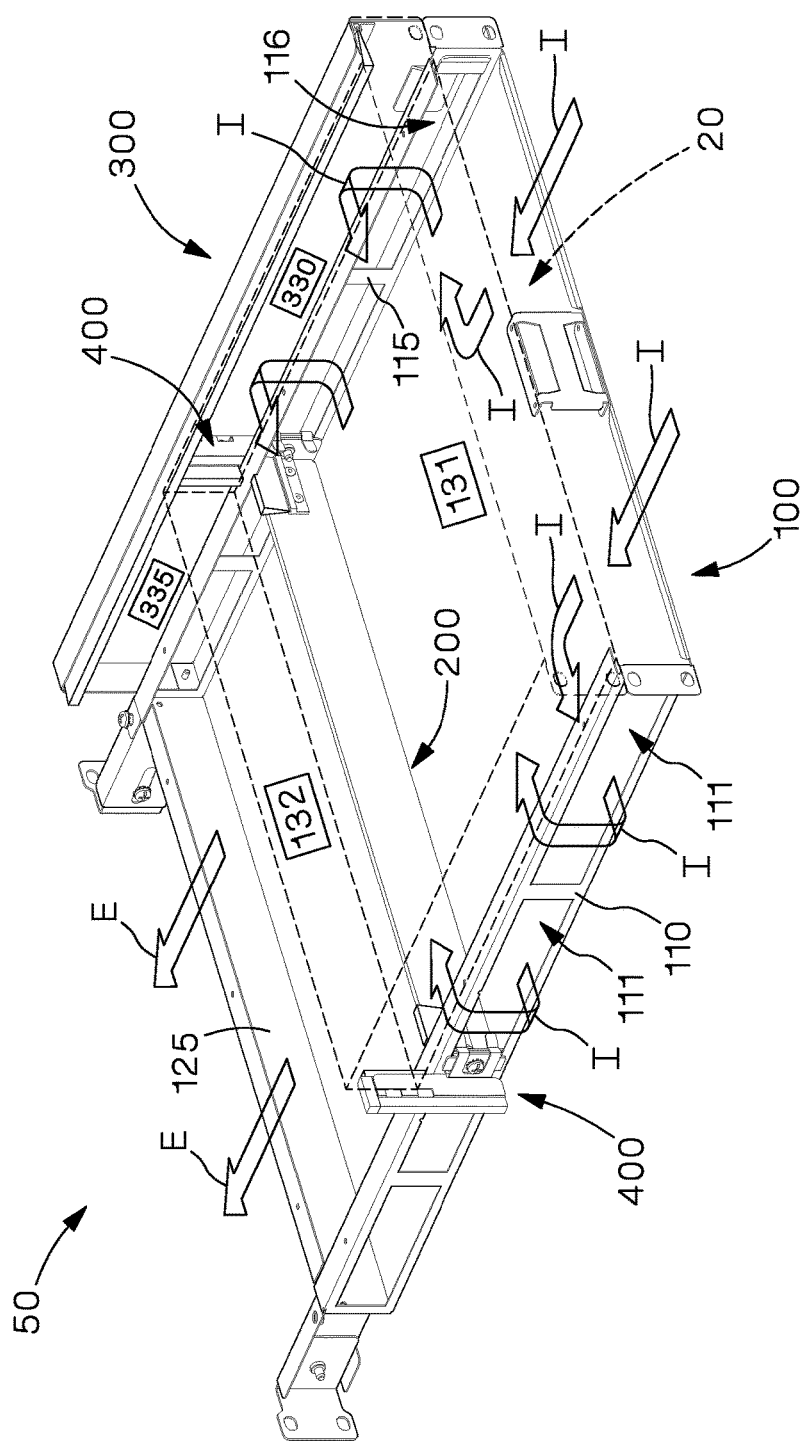
FIG. 16 is a front perspective view of the inlet duct system of FIG. 5 with the top wall removed, one side duct removed, and electronic equipment having side air inlets and rear exhaust and a depth less than that in FIG. 14 shown in phantom.
Figure 17:
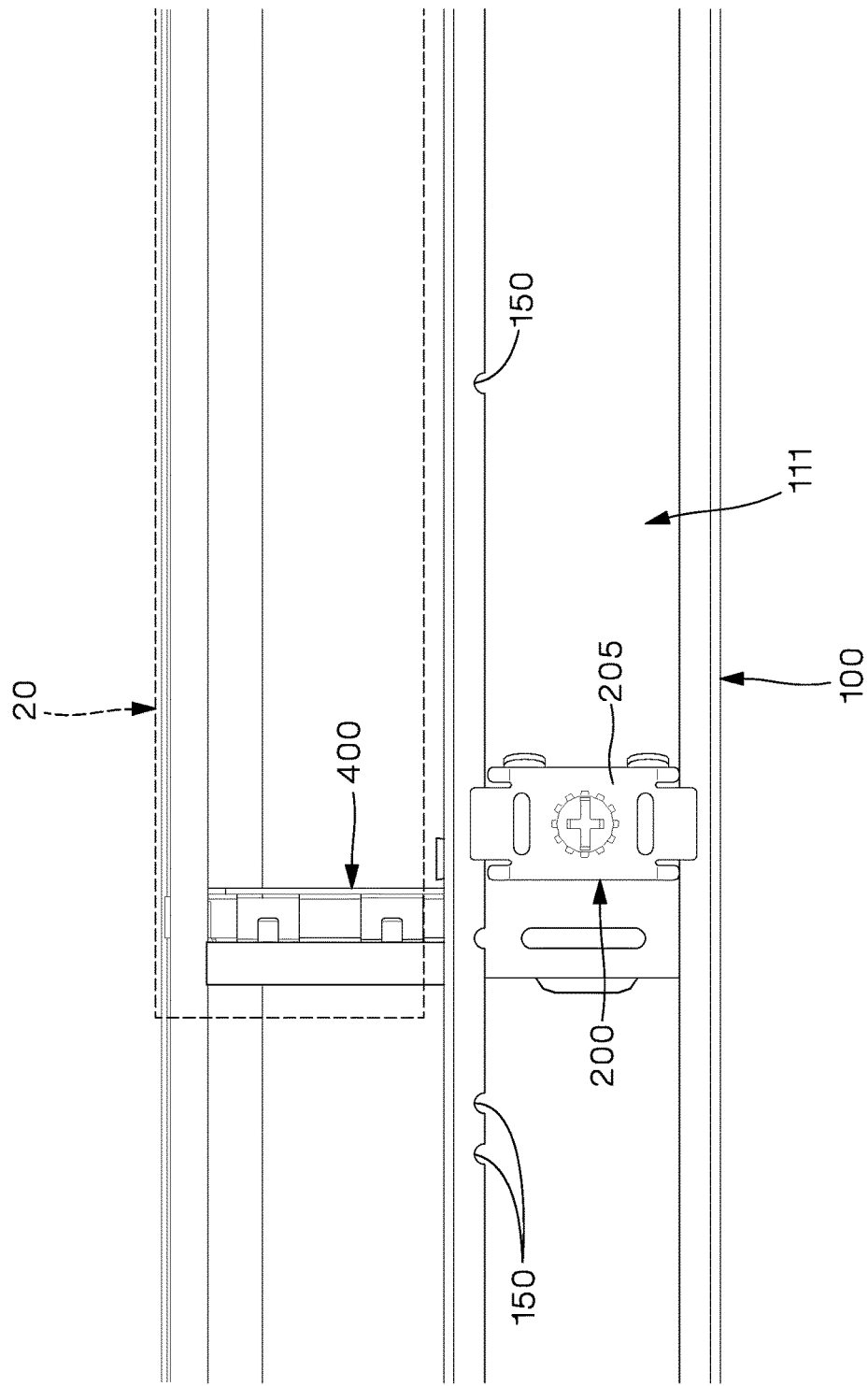
FIG. 17 is an expanded side view of the inlet duct system of FIG. 16 with the side baffle removed.

FIGS. 16-17 show an example inlet duct system 50 configured for use with electronic equipment 20 (shown in phantom) also having inlet flow on both sides of the equipment and exhaust flow on the rear of the equipment. Again, the left side duct 300 and top wall 120 of duct body 100 have been removed for ease of description. As discussed above, the difference between the electronic equipment 10 shown in FIGS. 14-15 and the electronic equipment 20 shown in FIGS. 16-17 is that electronic equipment 20 has a shorter depth than electronic equipment 10. The difference between the configuration shown in FIGS. 16-17 and that shown in FIGS. 14-15 is that internal baffle 200 is in a new location in internal cavity 130 and is spaced further from back wall 125 of duct body 100 to again be positioned near the back of electronic equipment 20. In this configuration, the inlet flow I and exhaust flow E are the same as that described above for FIGS. 14-15.

Figure 18:
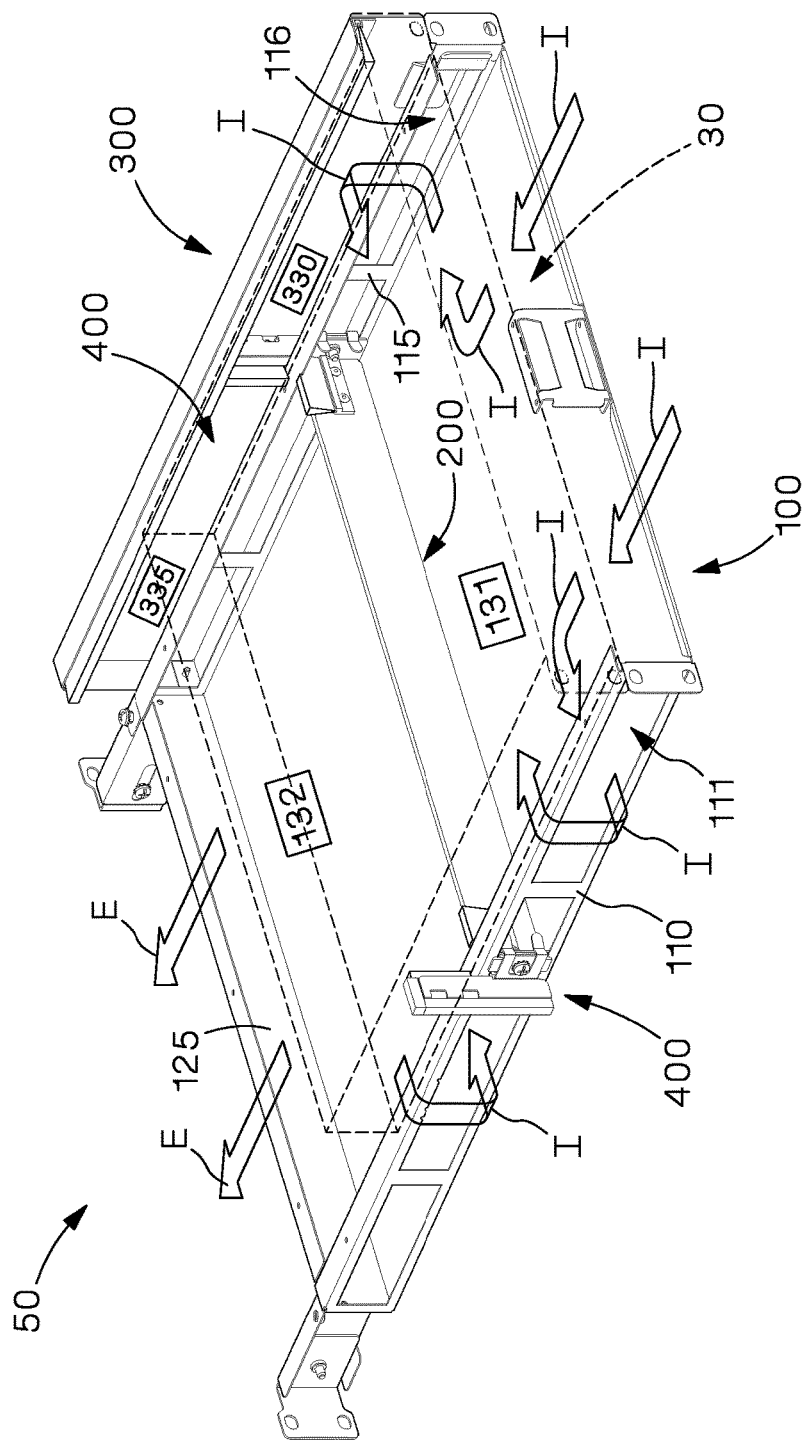
FIG. 18 is a front perspective view of the inlet duct system of FIG. 5 with the top wall removed, one side duct removed, and electronic equipment having side air inlets, a side exhaust, and rear exhaust shown in phantom.
Figure 19:
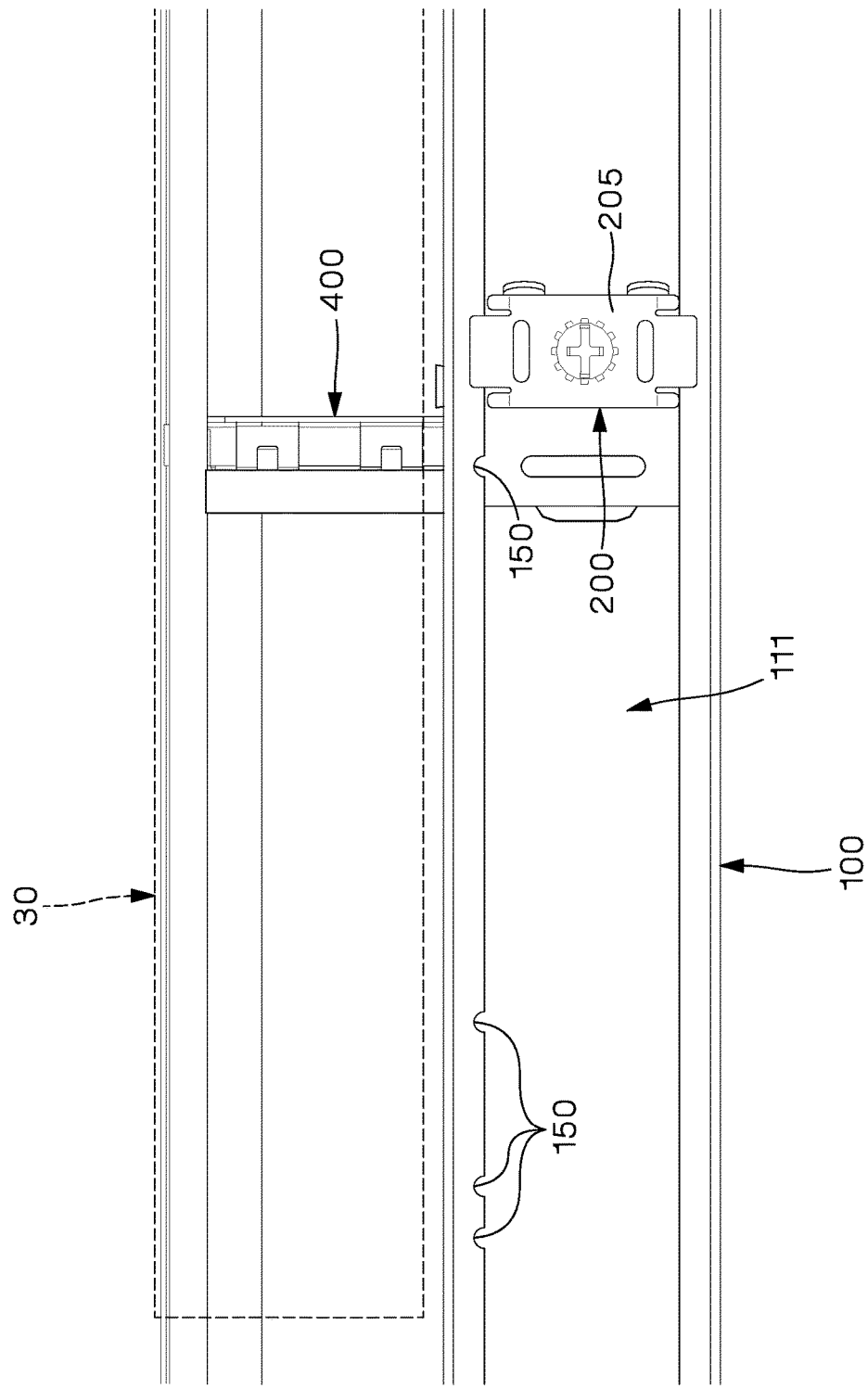
FIG. 19 is an expanded side view of the inlet duct system of FIG. 18 with the side baffle removed.
Figure 20:
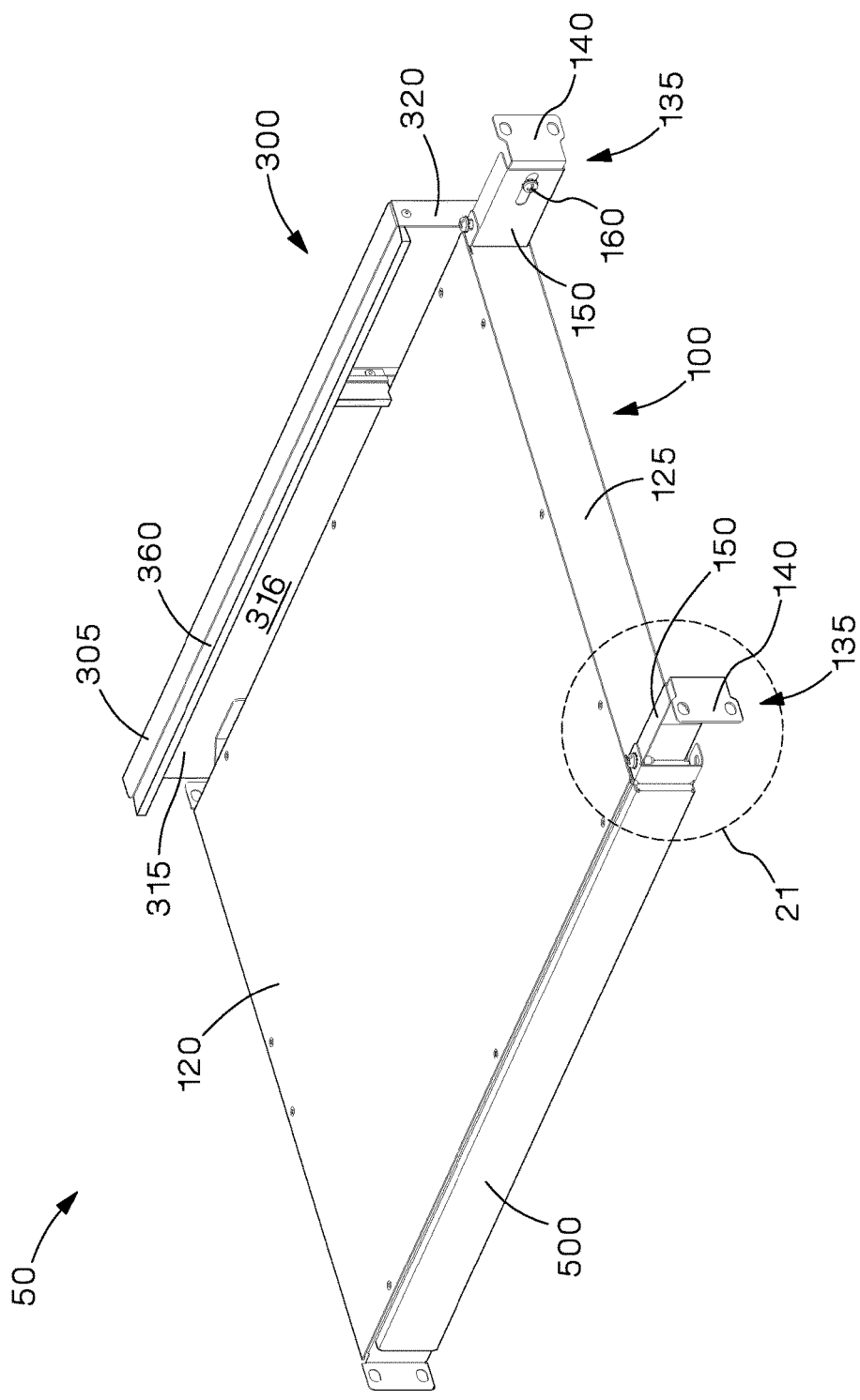
FIG. 20 is a rear perspective view of another example of an inlet duct system having one side duct and one blanking panel.
Figure 21:
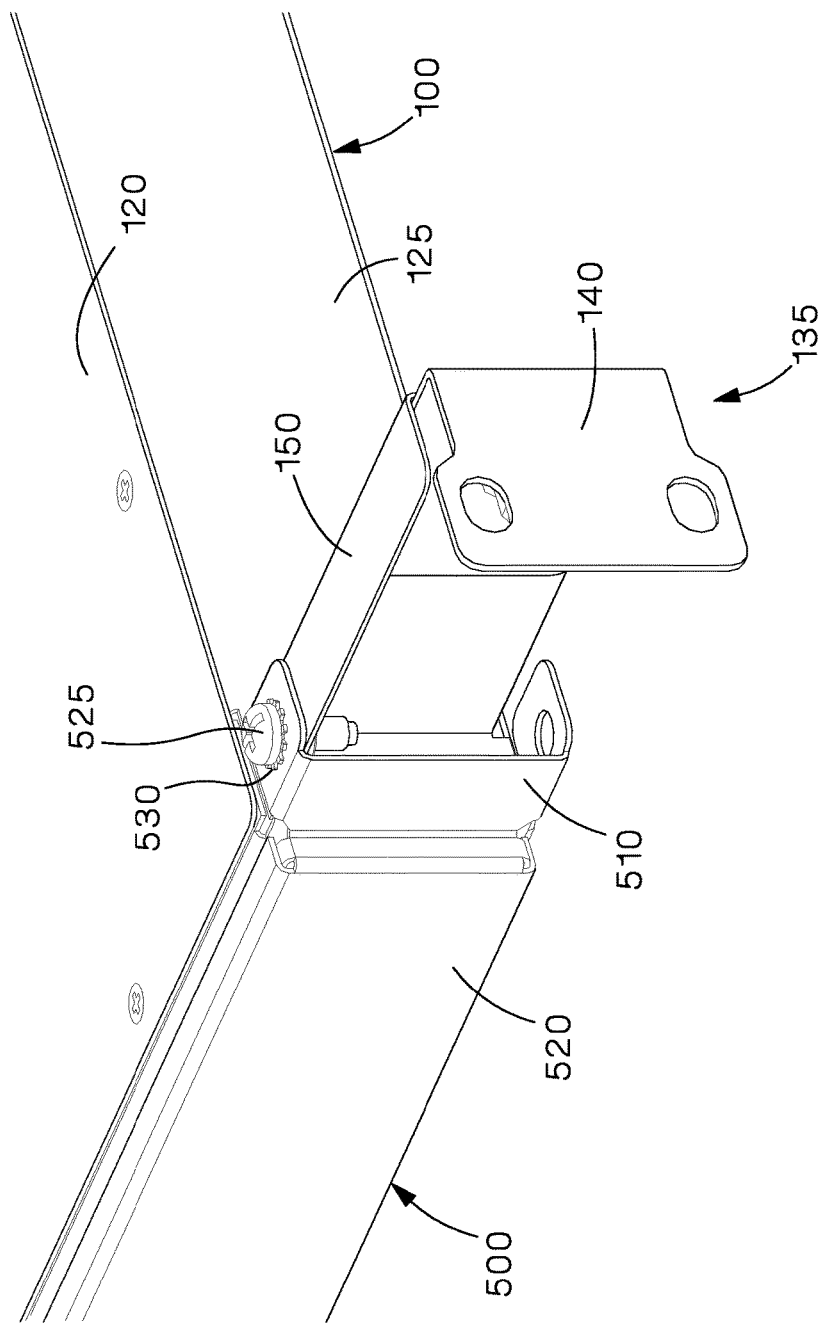
FIG. 21 is an expanded view of a portion of the inlet duct system of FIG. 20.

Referring to FIG. 18-19, an example inlet duct system 50 is shown configured for use with electronic equipment 30 (shown in phantom) having inlet flow on both sides of the equipment and exhaust flow on one side and the rear of the equipment. Again, the left side duct 300 and top wall 120 of duct body 100 have been removed for ease of description. In the configuration shown, internal baffle 200 is spaced from back wall 125 of duct body 100 and internal baffle 200 and side baffles 400 are positioned between the side inlet duct and the side exhaust duct of electronic equipment 30. The inlet flow I of cooling air can enter an open front portion of duct body 100 and flow into front portion 131 of internal cavity 130. Internal baffle 200 will inhibit the cooling air from flowing to rear portion 132 and direct inlet flow I out of openings 111, 116 in side walls 110, 115 and into front portion 330 of airflow chamber 325. Side baffles 400 will inhibit the cooling air from flowing to rear portion 335 and direct inlet flow I upwards and into the side intake vents of electronic equipment 30. Heated air will be exhausted from the side exhaust vent of electronic equipment 30 into rear portion 335 of side duct 300 which will direct the hot exhaust air rearwardly and from rear exhaust vents of electronic equipment and exhaust flow E. The position of internal baffle 200 and side baffles 400 will prevent the hot exhaust air from the side exhaust vent and from the rear exhaust vents from flowing from rear portions 335 of air flow chambers 325 of side ducts 300 back into front portions 300 and prevent the hot exhaust air from flowing from rear portion 132 of internal cavity 130 of duct body 100 back into front portion 131.

As discussed above, inlet duct system 50 can also be configured for use with electronic equipment 40 having inlet flow on one side of the equipment and exhaust flow on the opposite side of the equipment. To use inlet duct system 50 with electronic equipment 40 of this type, the side duct 300 and side baffle 400 on the side of the equipment having the exhaust flow are removed and replaced with a blanking panel. FIGS. 20-25 show an example inlet duct system 50 having this configuration.

Referring to FIGS. 20-25, duct body 100, rear support mounting brackets 135, adjustable internal baffle 200, left side duct 300, and left side baffle 400 of inlet duct system 50 are the same as those shown in FIGS. 5-13 and described above. The right side duct and right side baffle shown in FIGS. 5-13 have been removed in this example and replaced with blanking panel 500.

Blanking panel 500 closes off openings 116 in side wall 115 of duct body 100 when inlet duct system 50 is used with electronic equipment that does not require inlet air on that specific side. In the example shown, blanking panel 500 is removeably attached to duct body 100, opposite side duct 300, and seals against side wall 115 of duct body 100 to prevent the flow of air through openings 116 in side wall 115. A small strip of foam or other seal can be used if a gap remains between clamp plate 205 and side wall 520 of blanking panel 500 if desired. Similar to side duct 300, blanking panel 500 is attached to duct body 100 through a mounting tab 340 and a mounting flange 510, as shown in FIGS. 21-24. Mounting tab 505 has a general stair step configuration having a first portion secured to a side wall 520 of blanking panel 500 and a second portion spaced from side wall 520. Mounting tab 505 extends from side wall 520 and the second portion of mounting tab 505 slides into or otherwise engages opening 116 in side wall 115 of duct body 100. Mounting tab 505 slides into opening 116 in side wall 115 and captures blanking panel 500, holding it against duct body 100.

Mounting flange 510 extends from the rear of blanking panel 500 and has a hole (not shown) that aligns with a corresponding hole (not shown) in rear mounting portion 150 of side wall 115. Once mounting tab 505 is engaged with side wall 115 and the holes in mounting flange 510 and rear mounting portion 150 of side wall 115 are aligned, blanking panel 500 can be secured with a threaded member, such as a screw 525 and lock washer 530, inserted through the holes in mounting flange 510 and rear mounting portion 150.

Figure 22:
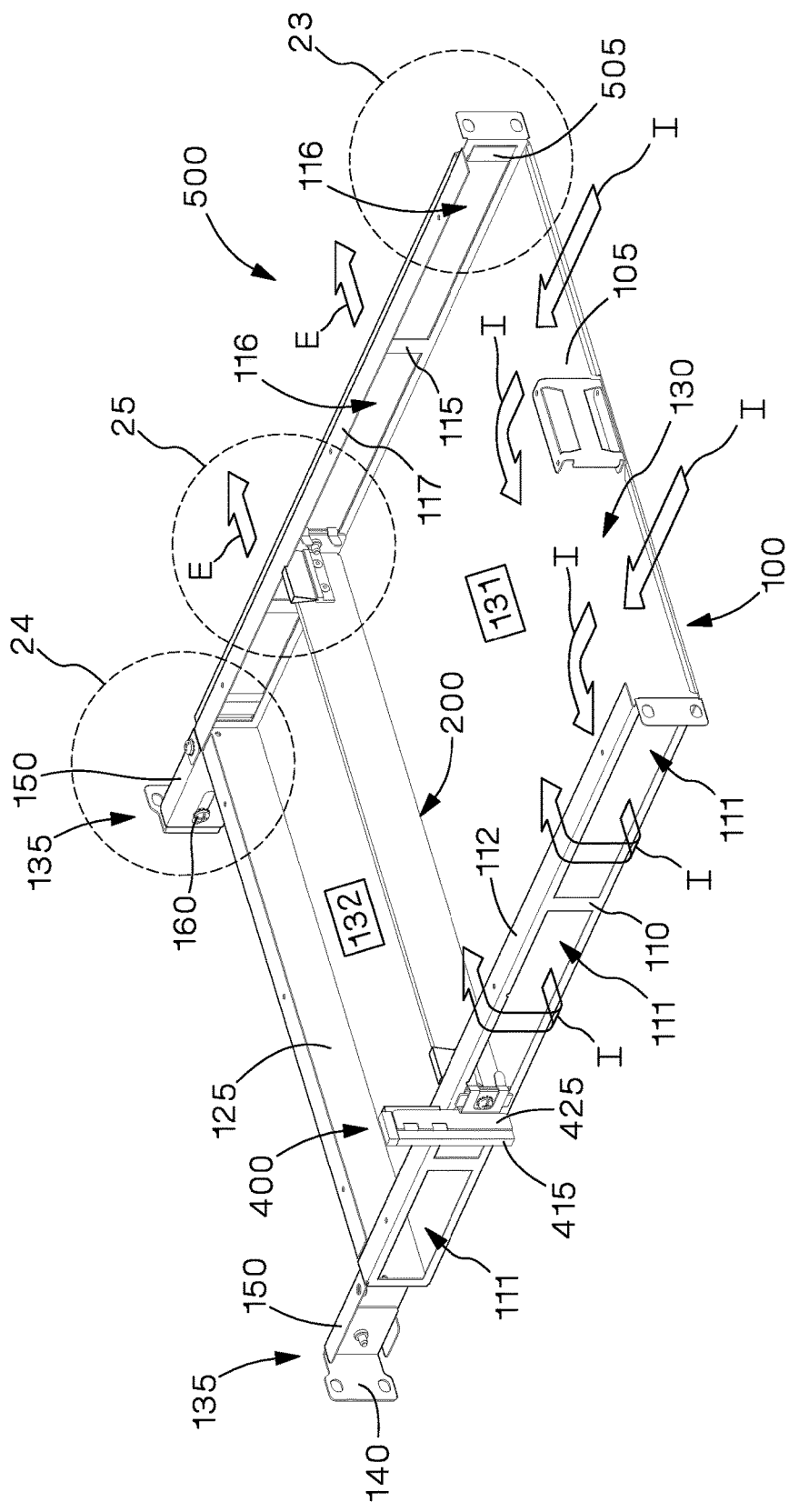
FIG. 22 is a front perspective view of the inlet duct system of FIG. 20 with the top wall and side duct removed.
Figure 23:
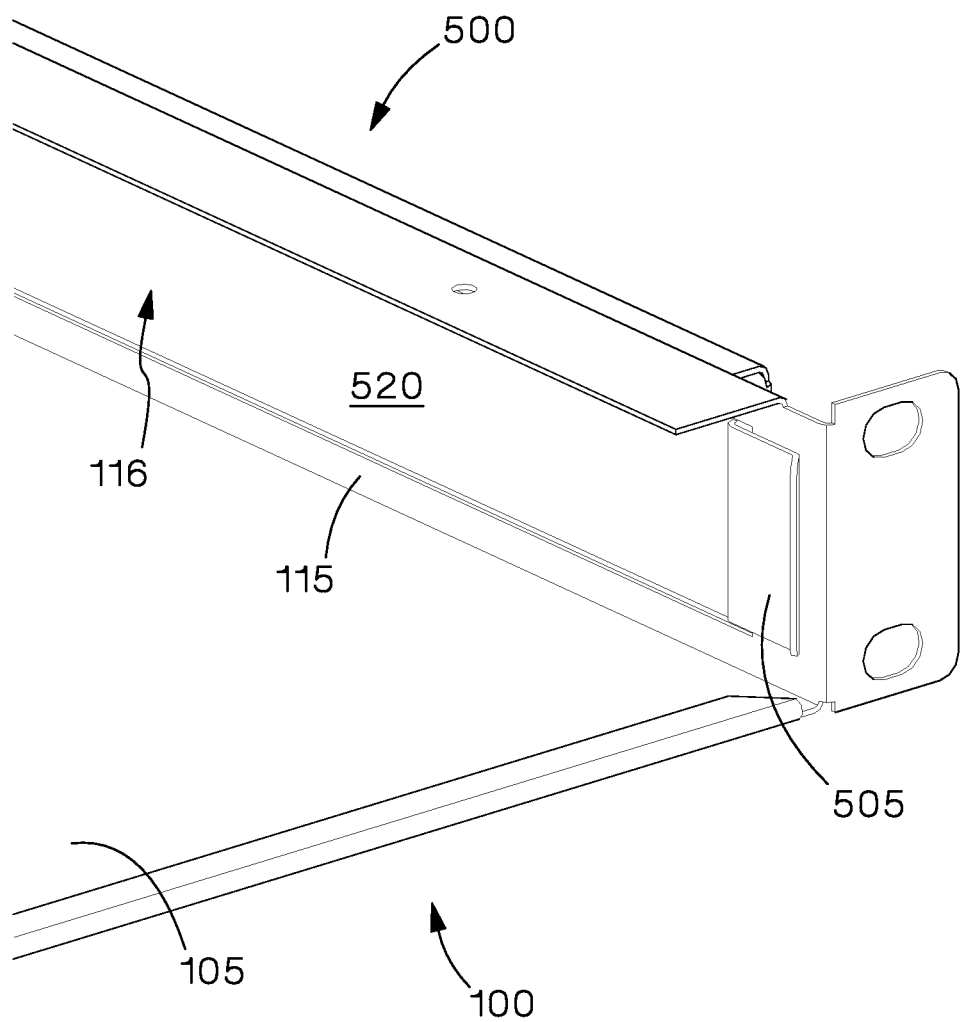
FIG. 23 is an expanded view of a portion of the inlet duct system of FIG. 22.
Figure 24:
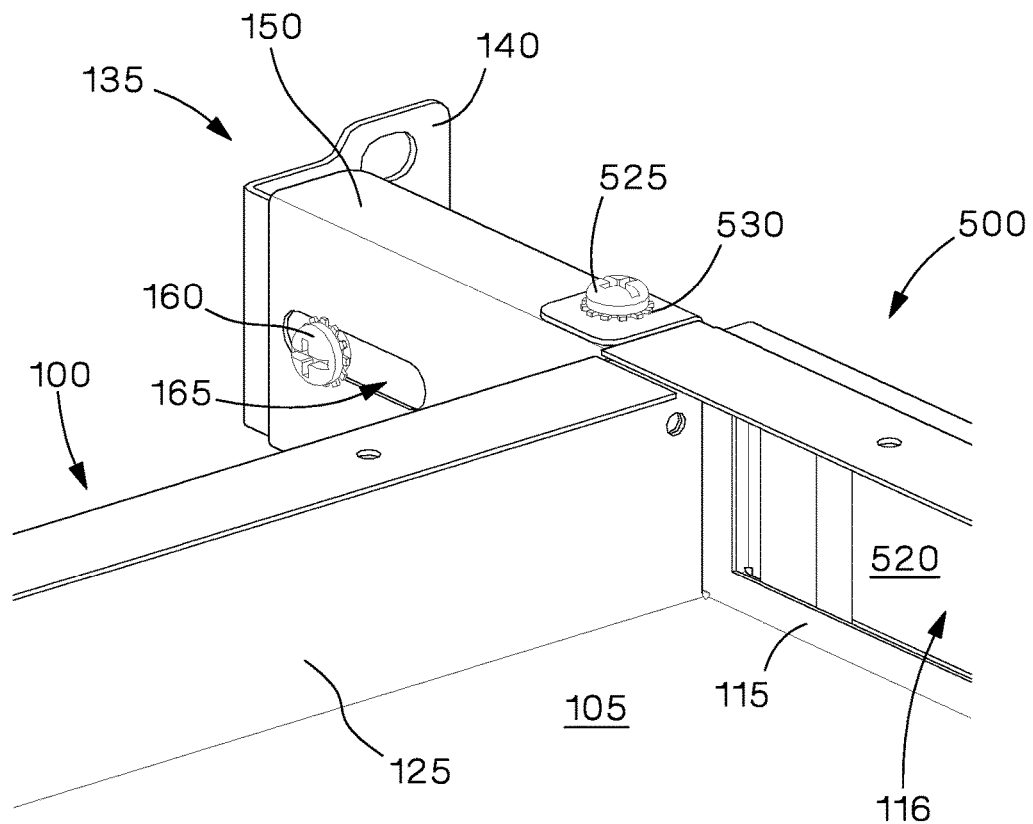
FIG. 24 is an expanded view of another portion of the inlet duct system of FIG. 22.
Figure 25:
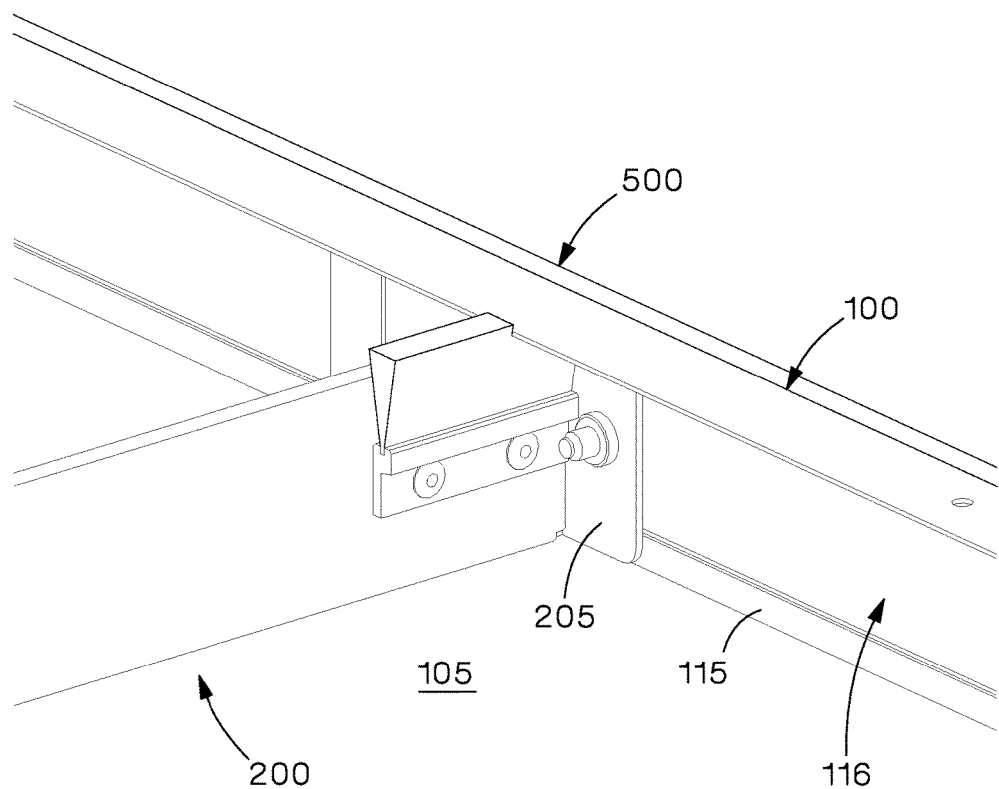
FIG. 25 is an expanded view of another portion of the inlet duct system of FIG. 22.
Figure 26:
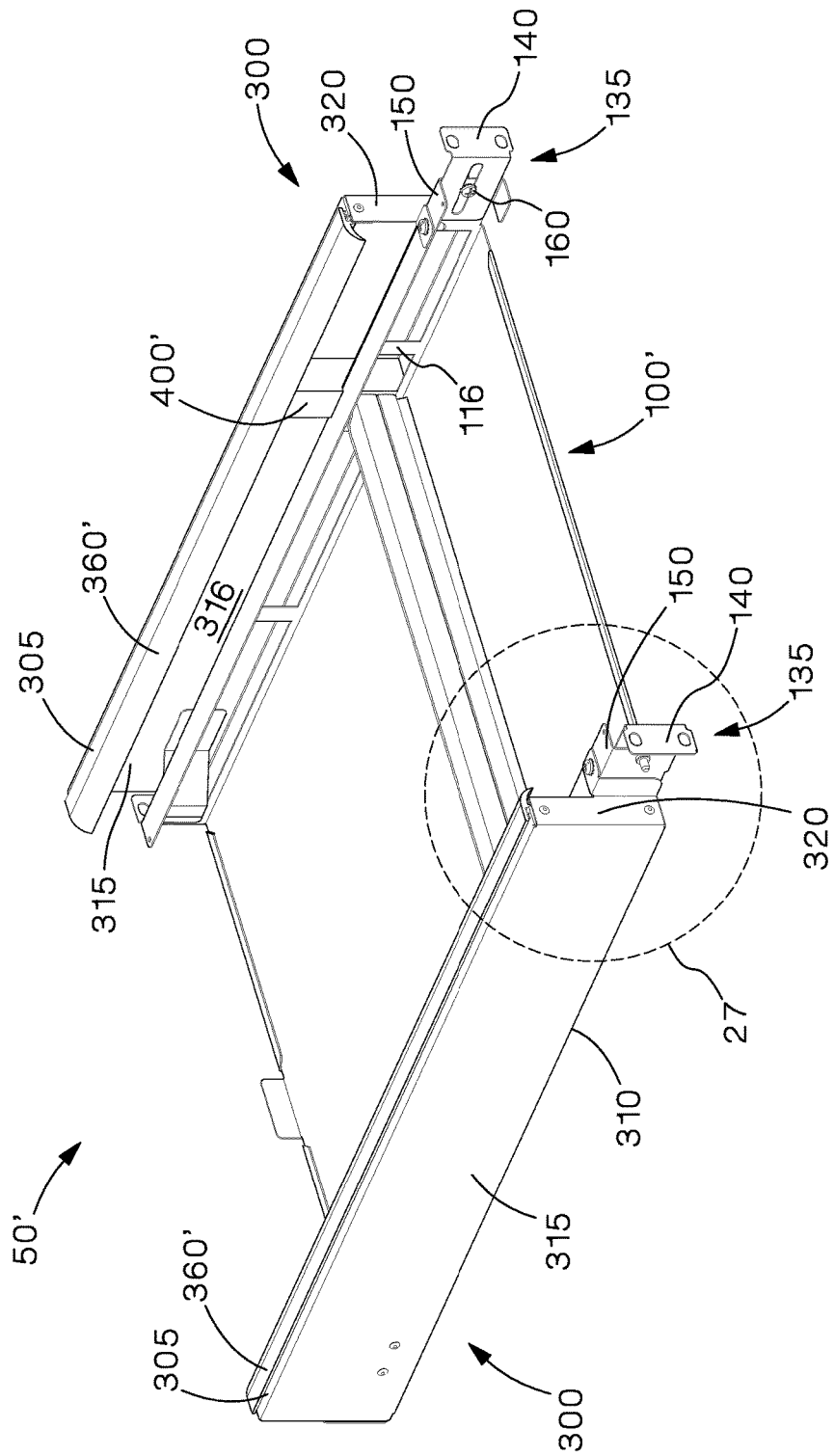
FIG. 26 is a rear perspective view of another example of an inlet duct system.
Figure 27:
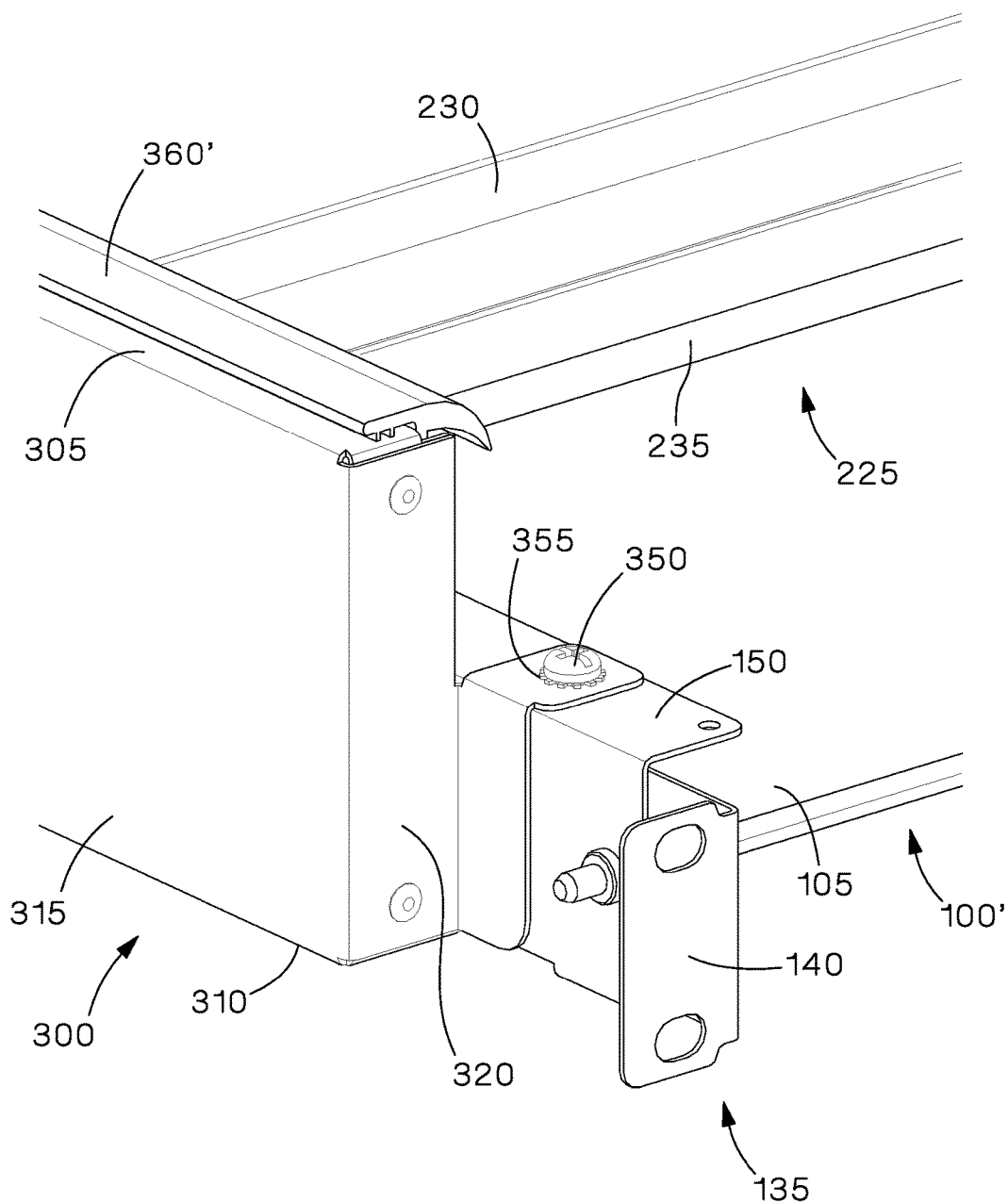
FIG. 27 is an expanded view of a portion of the inlet duct system of FIG. 26.
Figure 28:
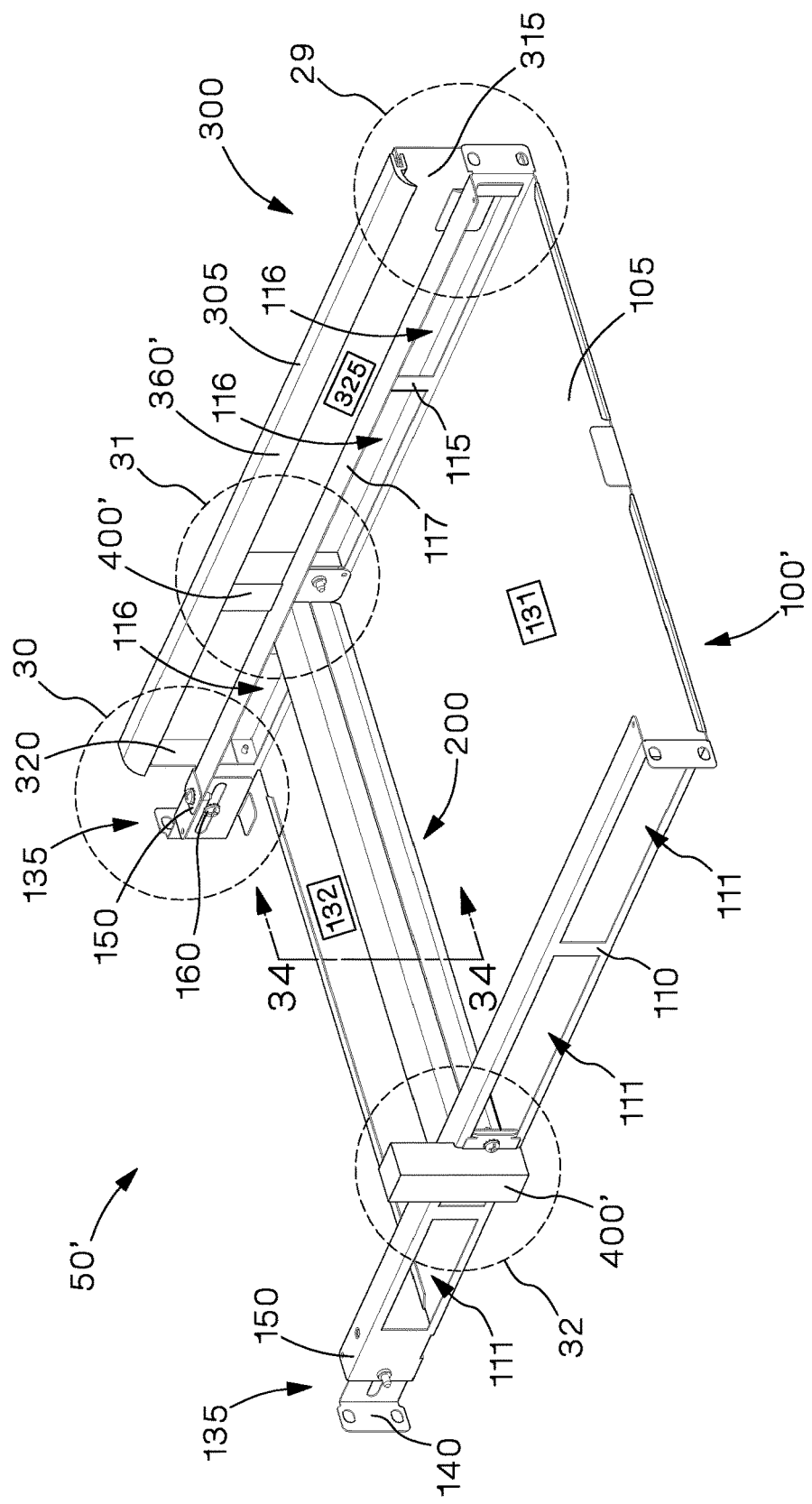
FIG. 28 is a front perspective view of the inlet duct system of FIG. 26 with the top wall and side duct removed.
Figure 29:
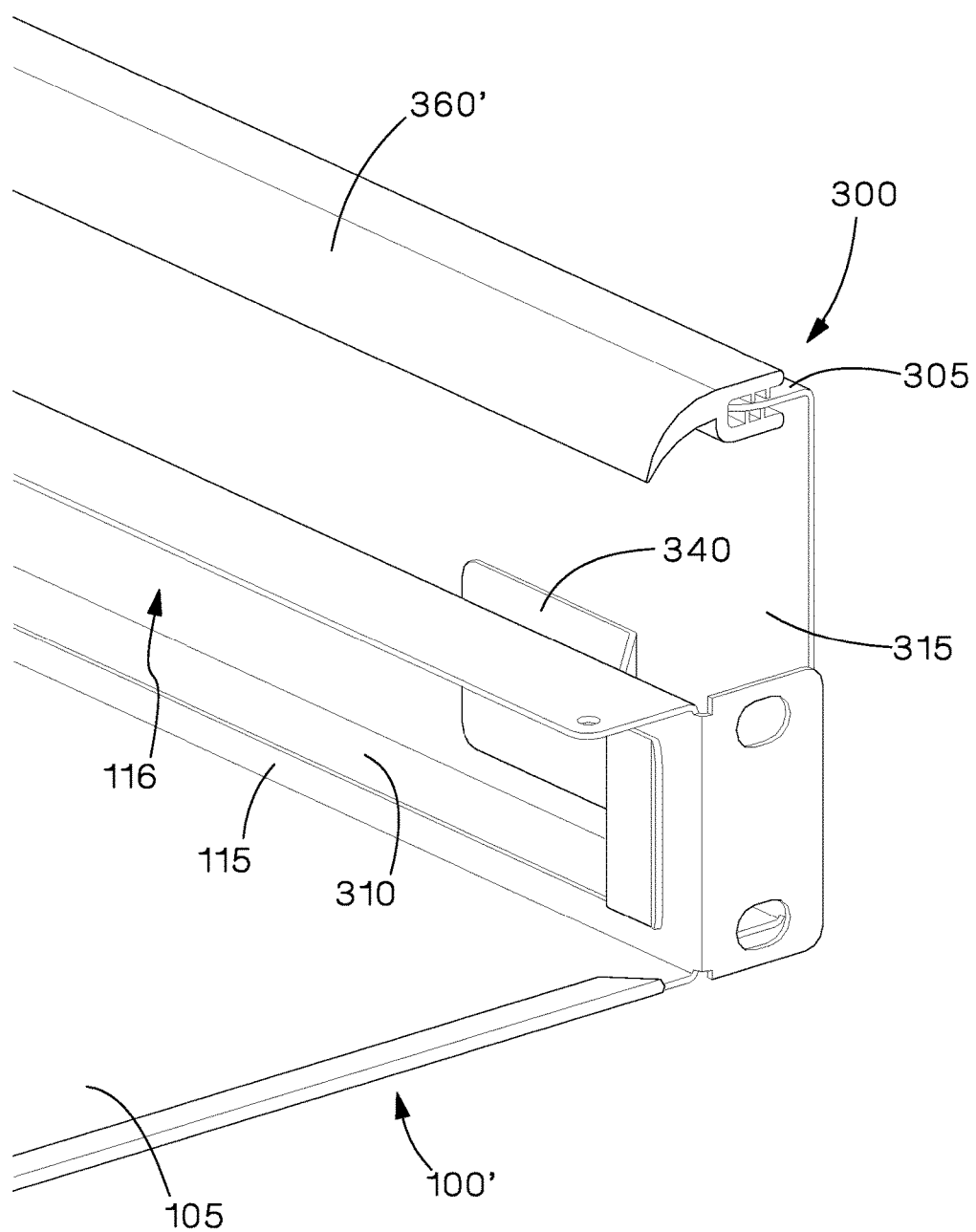
FIG. 29 is an expanded view of a portion of the inlet duct system of FIG. 28.
Figure 30:
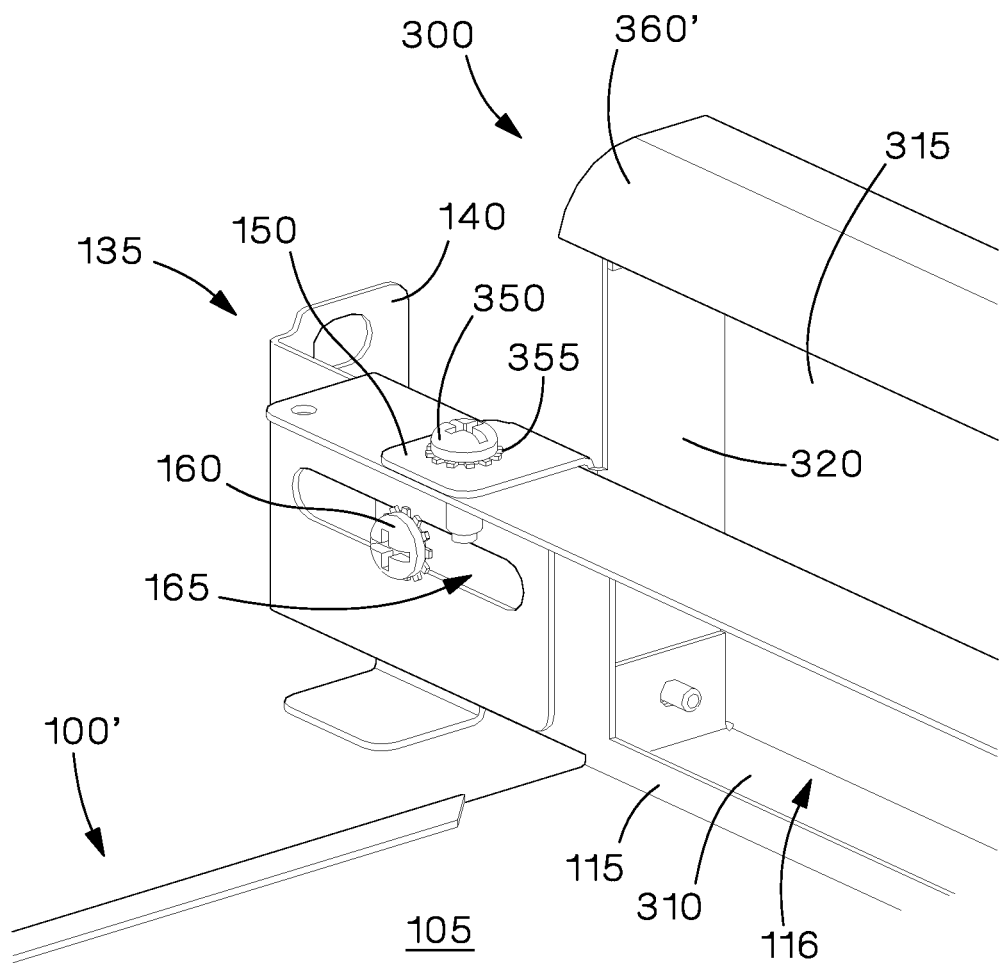
FIG. 30 is an expanded view of another portion of the inlet duct system of FIG. 28.
Figure 31:
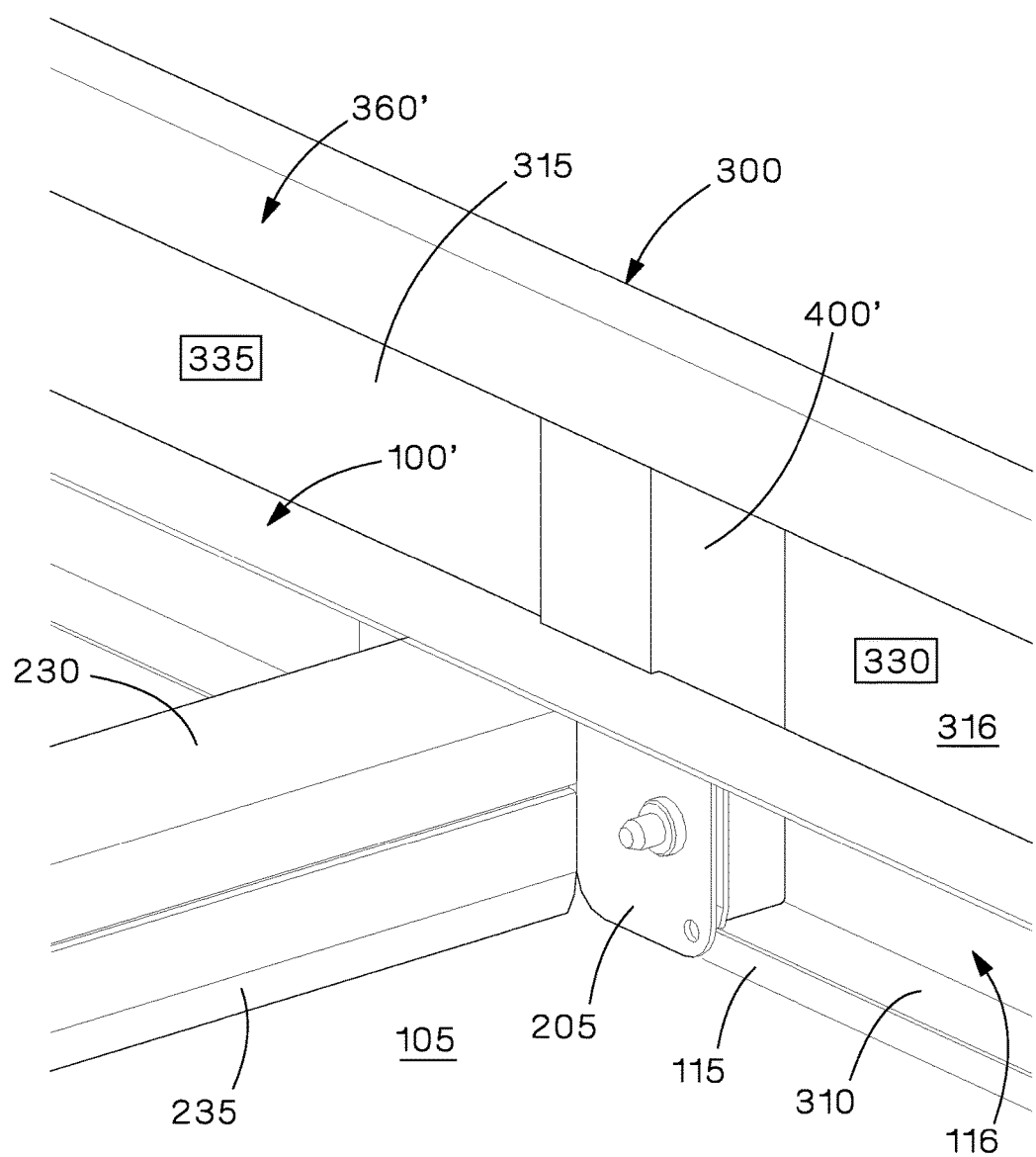
FIG. 31 is an expanded view of another portion of the inlet duct system of FIG. 28.
Figure 32:
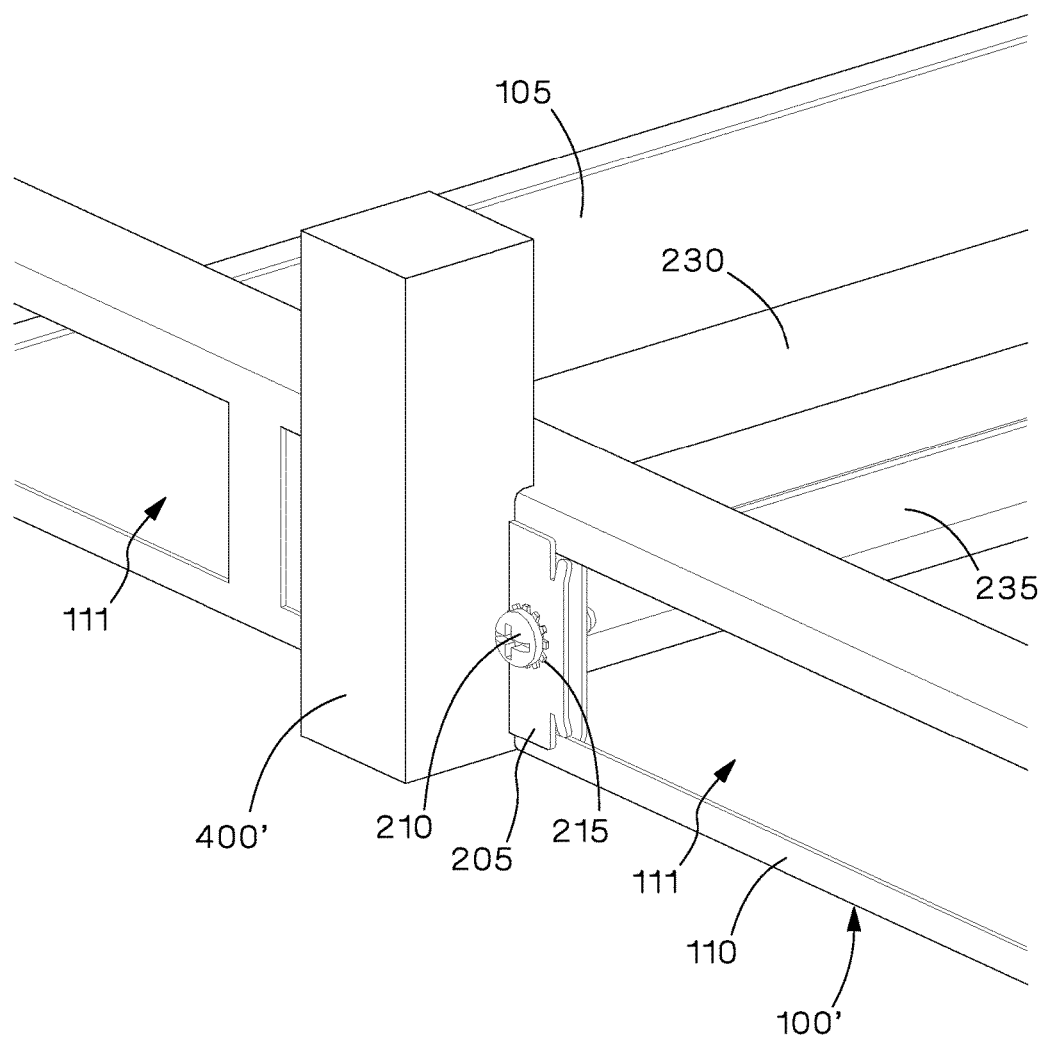
FIG. 32 is an expanded view of another portion of the inlet duct system of FIG. 28.
Figure 33:
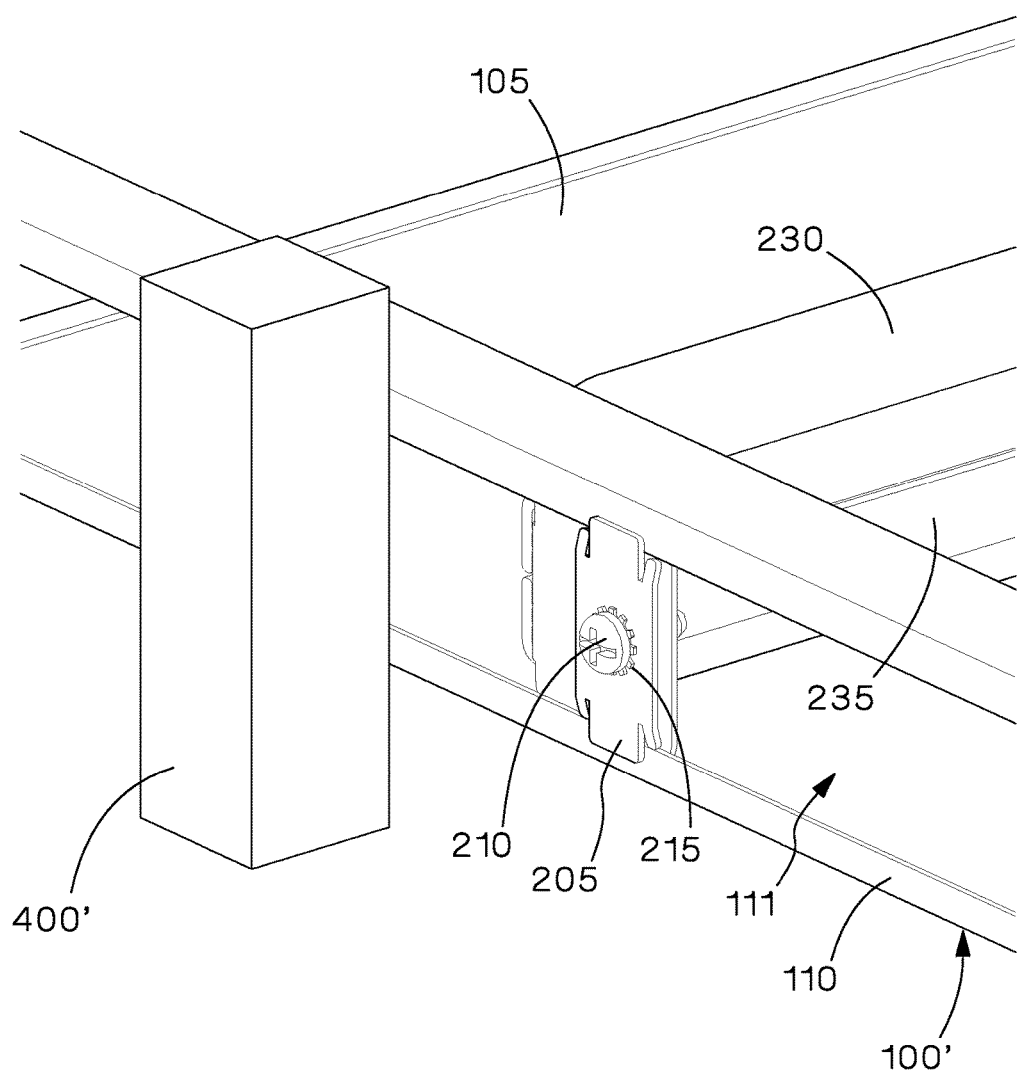
FIG. 33 is an exploded view of the portion of the inlet duct system of FIG. 32 with the side baffle removed.
Figure 34:
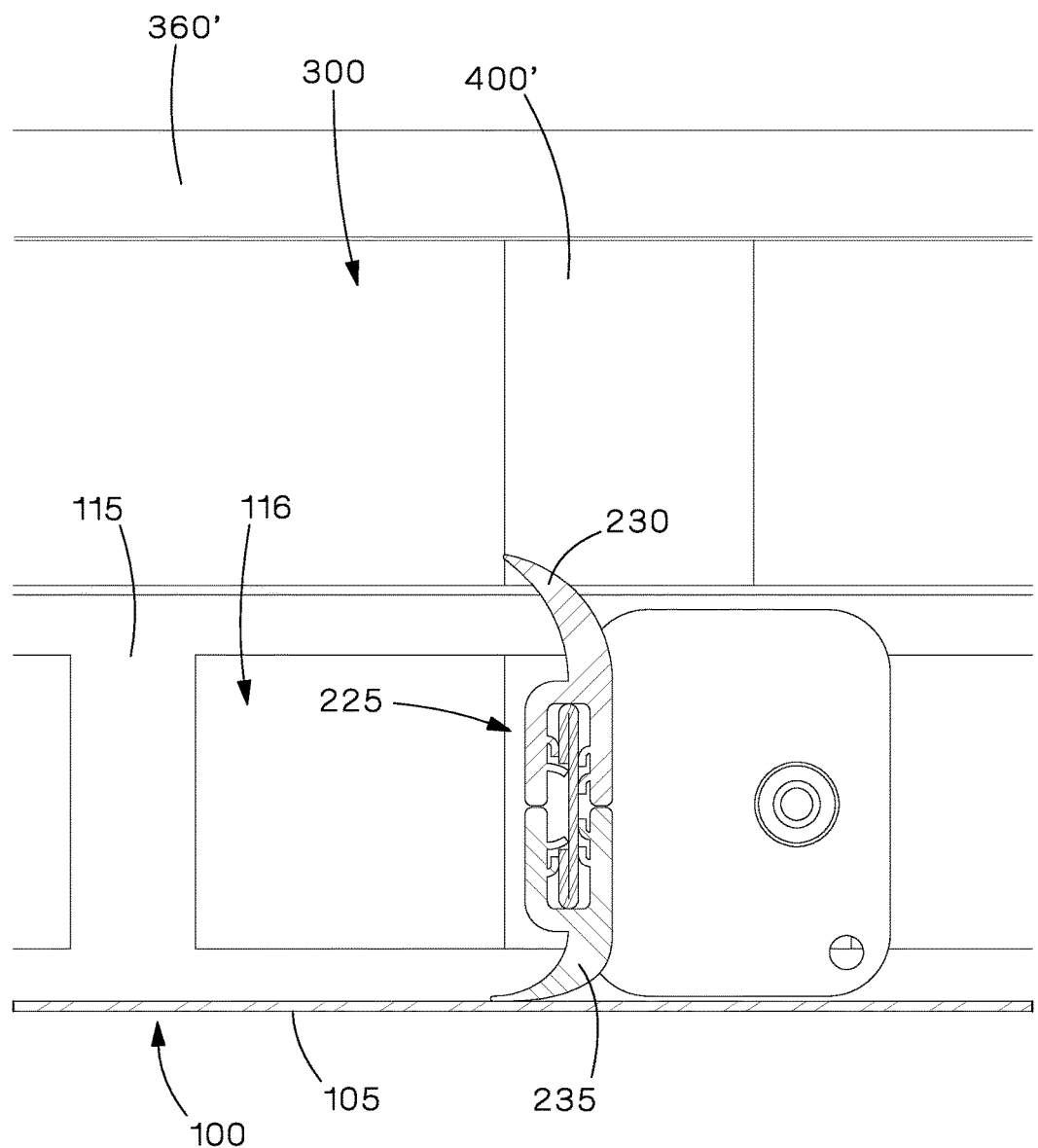
FIG. 34 is a cross sectional view of the inlet duct system of FIG. 28 taken along line 34-34.

Referring to FIG. 22, inlet duct system 50 is shown configured for use with electronic equipment 40 having inlet flow on one side of the equipment and exhaust flow on the other side of the equipment. The left side duct 300 and top wall 120 of duct body 100 have been removed for ease of description. In the configuration shown, internal baffle 200 is spaced from back wall 125 of duct body 100 and internal baffle 200 and left side baffle 400 are positioned near the back of electronic equipment 40. The inlet flow I of cooling air can enter an open front portion of duct body 100 and flow into front portion 131 of internal cavity 130. Internal baffle 200 will inhibit the cooling air from flowing to rear portion 132 and blanking panel will prevent cooling air from flowing out of openings 116 in side wall 115, thereby directing inlet flow I out of openings 111 in side wall 110 only and into front portion 330 of airflow chamber 325. Left side baffle 400 will inhibit the cooling air from flowing to rear portion 335 and direct inlet flow I upwards and into the side intake vents of electronic equipment 40 (see FIGS. 7 and 10). Heated air will be exhausted from side exhaust vents on the opposite side of electronic equipment and exhaust flow E will be directed into the cabinet. Blanking panel 500 will also prevent the hot exhaust air from the side exhaust from flowing back through openings 116 in side wall 115 and back into internal cavity 130 of duct body 100.

While electronic equipment 40 is shown and described as having inlet flow on the left side and exhaust flow on the right side, it is likewise contemplated that electronic equipment 40 may have inlet flow on the right side and exhaust flow on the left side, and that inlet duct system 50 may be reconfigured accordingly.

In order to provide an end user with as much flexibility as possible and allow for the configuration of inlet duct system 50 in all of the manners described above, the system can be provided as an inlet duct system kit. For example, an inlet duct system kit could include a duct body 100, and adjustable internal baffle 200, two side ducts 300, two side baffles 400, and a blanking panel 500, each as discussed above, which would allow the end user to configure the inlet duct system in any manner for use with any of different types of electronic equipment discussed above.

Referring to FIGS. 26-34 another example of an inlet duct system 50' is shown, which can reduce the cost of manufacture and improve manufacturability. Inlet duct system 50' functions the same and can be configured the same as inlet duct system 50 shown in FIGS. 5-25 and described above, but has a few structural differences, which are described in more detail below.

In this alternative example, inlet duct system 50' generally includes a duct body 100', an adjustable internal baffle 200, a side duct 300, and a side baffle 400'. As described above, depending on the configuration for particular electronic equipment, inlet duct system 50' could have two side ducts 300 or one side duct 300 and a blanking panel 500.

In the example shown, duct body 100' is the same as duct body 100 described above in inlet duct system 50, except that duct body 100' does not have a top wall or a back wall. Rather than having a top wall, this example uses the bottom of the electronic equipment as the top wall and a seal member 225 on internal baffle 200 to create a seal to the bottom of the electronic equipment, as discussed in more detail below.

Adjustable internal baffle 200 has the same basic structure as that described above for inlet duct system 50 and can be secured to side walls 110, 115 of duct body 100' in the same manner, except that in this alternative example a sealing member 225 is secured to internal baffle 200. As can best be seen in FIG. 34, sealing member 225 has an upper member 230 that extends upward to seal against a bottom side of electronic equipment (not shown) used with inlet duct system 50' and a lower member 235 that extends downward to seal against bottom wall 105 of duct body 100'. Rather than having upper and lower members, sealing member 225 could also be a single unitary member that extends in both directions or in only one direction. In addition, as shown in this example, sealing member 225 is flexible flap seal. However, sealing member 225 could also be a brush seal or any other well know seal as desired.

Side ducts 300 are also the same as described above for inlet duct system 50. The only different being that seal member 360' in inlet duct system 50' is a flap seal, where seal member 360 in inlet duct system 50 is shown as a brush seal. Otherwise, the structure and functionality of side ducts 300 is the same as above, including the mounting of side ducts 300 to duct body 100' through mounting tab 340 and mounting flange 345.

As discussed above side baffles 400' are used with side ducts 300 and can be positioned within air flow chamber 325 of side duct 300, preferably adjacent internal baffle 200, to partition air flow chamber 325 into a front portion 330 and a rear portion 335 and inhibit the flow of air between front and rear portions 330, 335. However, in this alternate example, side baffles 400' are rectangular foam seals that extend vertically between top wall 305 and bottom wall 310 of side duct 300 and horizontally between side wall 315 of side duct 300 and side wall 110, 115 of duct body 100'. Side baffles 400' can be secured to the inside of side duct 300, for example through a compression fit or by an adhesive, or can be secured to duct body 100', for example by an adhesive. Preferably, side baffles 400' are secured to internal baffle 200, for example by an adhesive, so that side baffle 400' is moveable with internal baffle 200.

To provide flexibility for use with cabinets and/or racks of various sizes, inlet duct system 50' can also have a pair of adjustable rear support mounting brackets 135 as described above.

In order to provide an end user with as much flexibility as possible and allow for the configuration of inlet duct system 50' in all of the manners described above, the system can also be provided as an inlet duct system kit. For example, an inlet duct system kit could include a duct body 100', and adjustable internal baffle 200, two side ducts 300, two side baffles 400', and a blanking panel 500, each as discussed above, which would allow the end user to configure the inlet duct system in any manner for use with any of different types of electronic equipment discussed above.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation.

The actual scope of the invention is intended to be defined in the following claims when viewed in their proper perspective based on the prior art.

What is claimed:

1. An inlet duct system, comprising:
   a duct body comprising a bottom wall and two side walls extending from opposing side edges of the bottom wall, each side wall having at least one opening formed therethrough;
   an adjustable internal baffle secured to the duct body such that the internal baffle can be positioned in multiple locations within an internal cavity defined by the duct body, the internal baffle partitioning the internal cavity into a front portion and a rear portion and inhibiting the flow of air between the front portion and the rear portion of the internal cavity;
   a first side duct removably attached to the duct body, the first side duct comprising a top wall, a bottom wall, and a side wall extending between the top wall and the bottom wall and forming an air flow chamber configured to receive air from the at least one opening in one of the side walls of the duct body and deliver the air to a location above the duct body; and
   a first side baffle positioned within the air flow chamber of the first side duct adjacent the internal baffle, the first side baffle extending between the top wall and the bottom wall of the first side duct and between the side wall of the first side duct and the side wall of the duct body to partition the air flow chamber into a front portion and a rear portion and inhibit the flow of air between the front portion and the rear portion of the air flow chamber, wherein the first side baffle is removably secured to and moveable with the internal baffle, the first side baffle comprises a mounting tab and at least one latch finger;
   the mounting tab is configured to engage a slot formed in an end of the internal baffle; and
   the at least one latch finger is configured to engage a clamp plate secured to the end of the internal baffle.

2. The inlet duct system of claim 1, further comprising a second side duct removably attached to the duct body, opposite the first side duct, the second side duct comprising a top wall, a bottom wall, and a side wall extending between the top wall and the bottom wall and forming an air flow chamber configured to receive air from the at least one opening in the other side wall of the duct body and deliver the air to a location above the duct body.

3. The inlet duct system of claim 2, further comprising second side baffle positioned within the air flow chamber of the second side duct adjacent the internal baffle, the second side baffle extending between the top wall and the bottom wall of the second side duct and between the side wall of the second side duct and the side wall of the duct body to partition the air flow chamber into a front portion and a rear portion and inhibit the flow of air between the front portion and the rear portion of the air flow chamber.

4. The inlet duct system of claim 1, further comprising a pair of adjustable rear support mounting brackets, each rear support mounting bracket moveably attached to one of the side walls and having a mounting flange configured to secure each of the rear support mounting brackets to a corresponding vertical support member.

5. The inlet duct system of claim 1, wherein the internal baffle is secured to the side walls of the duct body via first and second clamp plates secured to opposite ends of the internal baffle.

6. The inlet duct system of claim 5, wherein the first and second clamp plates are secured to the opposite ends of the internal baffle via screws and lock washers.

7. The inlet duct system of claim 1, wherein the first side duct further comprises:
   a back wall extending between the top wall, the bottom wall, and the side wall of the first side duct;
   a mounting tab extending from the side wall, the mounting tab configured to engage the at least one opening formed in the side wall of the duct body; and
   a mounting flange extending from the back wall, the mounting flange having a hole formed therethrough positioned to align with a second hole formed in the side wall of the duct body to removably secure the first side duct to the duct body.

8. The inlet duct system of claim 1, wherein the first side duct further comprises a seal member extending from the top wall of the first side duct and configured to seal against electronic equipment used with the inlet duct system.

9. The inlet duct system of claim 8, wherein the seal member is one of a brush seal and a flap seal.

10. The inlet duct system of claim 1, further comprising a blanking panel removably attached to the duct body, opposite the first side duct, and configured to prevent the flow of air through the at least one opening formed in the side wall of the duct body adjacent the blanking panel.

11. The inlet duct system of claim 10, wherein the blanking panel comprises:
    a mounting tab configured to engage the at least one opening formed in the side wall of the duct body adjacent the blanking panel; and
    a mounting flange having a hole formed therethrough positioned to align with a second hole formed in the side wall of the duct body to removable secure the first side duct to the duct body.

12. The inlet duct system of claim 1, wherein the first side baffle comprises a foam seal secured to the first side duct.

13. The inlet duct system of claim 12, wherein the first side baffle is secured to the first side duct through a compression fit.

14. The inlet duct system of claim 1, wherein the first side baffle comprises a foam seal secured to the duct body.

15. The inlet duct system of claim 1, wherein the first side baffle comprises a foam seal secured to the internal baffle and moveable with the internal baffle.

16. The inlet duct system of claim 1, wherein the internal baffle comprises a sealing member, the sealing member extending downward to seal against the bottom wall of the duct body and extending upward to seal against a bottom side of electronic equipment used with the inlet duct system.

17. The inlet duct system of claim 1, wherein the duct body further comprises a top wall extending between the side walls, opposite the bottom wall.

18. The inlet duct system of claim 17, wherein the duct body further comprises a back wall extending between the top wall, the bottom wall, and the side walls.

19. The inlet duct system of claim 1, wherein the first side baffle further comprises:
    at least one foam seal, the at least one foam seal configured to form a seal against an inner side surface of the first side duct and an inner top surface of the first side duct; and
    a brush seal, the brush seal configured to form a seal against electronic equipment used with the inlet duct system.

* * * * *